(12) United States Patent
Hagihara et al.

(10) Patent No.: US 8,729,946 B2
(45) Date of Patent: May 20, 2014

(54) CLOCK GENERATION CIRCUIT AND IMAGING DEVICE

(75) Inventors: Yoshio Hagihara, Tokyo (JP); Susumu Yamazaki, Tokyo (JP)

(73) Assignee: Olympus Corporation, Tokyo (JP)

( * ) Notice: Subject to any disclaimer, the term of this patent is extended or adjusted under 35 U.S.C. 154(b) by 183 days.

(21) Appl. No.: 13/444,271

(22) Filed: Apr. 11, 2012

(65) Prior Publication Data

US 2012/0318958 A1   Dec. 20, 2012

(30) Foreign Application Priority Data

Apr. 11, 2011 (JP) ............................... P2011-087533
Apr. 5, 2012 (JP) ............................... P2012-086424

(51) Int. Cl.
*H03K 3/3565* (2006.01)
*H03M 1/56* (2006.01)
*H03M 1/14* (2006.01)

(52) U.S. Cl.
CPC ............... *H03K 3/3565* (2013.01); *H03M 1/14* (2013.01); *H03M 1/56* (2013.01)
USPC ............................ 327/291; 341/169; 341/156

(58) Field of Classification Search
CPC ..................................................... H03K 3/3565
See application file for complete search history.

(56) References Cited

U.S. PATENT DOCUMENTS

| | | | | |
|---|---|---|---|---|
| 5,909,134 A | * | 6/1999 | Sohn et al. | 327/295 |
| 2003/0213972 A1 | * | 11/2003 | Ichiguchi et al. | 257/159 |
| 2008/0143410 A1 | * | 6/2008 | Onishi et al. | 327/185 |
| 2010/0271525 A1 | * | 10/2010 | Takahashi | 341/169 |
| 2011/0291742 A1 | * | 12/2011 | Wang et al. | 327/513 |

FOREIGN PATENT DOCUMENTS

| | | |
|---|---|---|
| JP | 2008092091 A * | 4/2008 |
| JP | 2009-038781 A | 2/2009 |

OTHER PUBLICATIONS

Shin, Mhun et al., "Meta-Stability Characteristic of Single-Slope ADC with Time to Digital Convertor for CMOS-Image Sensor", IEICE Technical Report, Oct. 2009, pp. 75-80, w/translation.
Shin, Mhun et al., "Meta-Stability Characteristic of Single-Slope ADC with Time to Digital Convertor for CMOS-Image Sensor", IEICE Technical Report, Oct. 2009, pp. 1-7, w/translation.

* cited by examiner

*Primary Examiner* — Howard Williams
(74) *Attorney, Agent, or Firm* — Westerman, Hattori, Daniels & Adrian, LLP

(57) ABSTRACT

A clock generation circuit includes first and second logic circuits and a switch circuit. The first logic circuit has a first circuit threshold value lower than a circuit threshold value of a front-stage circuit, receives an input clock output from the front-stage circuit, and outputs a first output signal in accordance with a logic state of the input clock and the first circuit threshold value. The second logic circuit has a second circuit threshold value higher than the circuit threshold value of the front-stage circuit, receives the input clock output from the front-stage circuit, and outputs a second output signal in accordance with the logic state of the input clock and the second circuit threshold value. The switch circuit receives the first and second output signals and outputs, as an output clock, one of first and second voltages corresponding to different logic states.

10 Claims, 29 Drawing Sheets

FIG. 4

|  | $V_{IN}$ | $A_{OUT}$ | $B_{OUT}$ | $V_{OUT}$ | NOTE |
|---|---|---|---|---|---|
| T1 | 0 | 1 | 1 | 0 | |
| T2 | * | 0 | 1 | 0 | ← RETAINING PREVIOUS STATE (IN THIS CASE, "0") |
| T3 | 1 | 0 | 0 | 1 | |
| T4 | * | 0 | 1 | 1 | ← RETAINING PREVIOUS STATE (IN THIS CASE, "1") |
| T1' | 0 | 1 | 1 | 0 | |
| T2' | * | 0 | 1 | 0 | |

FIG. 5

|  | P1 | P2 | N1 | N2 |
|---|---|---|---|---|
| STATE 1 | OFF | OFF | ON | ON |
| STATE 2 | ON | OFF | OFF | ON |
| STATE 3 | ON | ON | OFF | OFF |
| STATE 4 | ON | OFF | OFF | ON |
| STATE 1' | OFF | OFF | ON | ON |

FIG. 16

| | $V_{IN1}$ | $V_{IN2}$ | $A_{OUT}$ | $B_{OUT}$ | $V_{OUT}$ | REMARK |
|---|---|---|---|---|---|---|
| T1 → | 0 | 1 | 0 | 0 | 1 | ← PREVIOUS STATE (IN THIS CASE, "1") IS RETAINED IN OUTPUT VOLTAGE $V_{OUT}$ |
| T2 → | 1 | 1 | 0 | 0 | 1 | ← PREVIOUS STATE (IN THIS CASE, "1") IS RETAINED IN OUTPUT VOLTAGE $V_{OUT}$ |
| T3 → | 1 | * | 0 | 1 | 1 | |
| T4 → | 1 | 0 | 1 | 1 | 0 | |
| T5 → | 0 | 0 | 1 | 1 | 0 | ← PREVIOUS STATE (IN THIS CASE, "0") IS RETAINED IN OUTPUT VOLTAGE $V_{OUT}$ |
| T6 → | 0 | * | 0 | 1 | 0 | ← PREVIOUS STATE (IN THIS CASE, "0") IS RETAINED IN OUTPUT VOLTAGE $V_{OUT}$ |
| T1' → | 0 | 1 | 0 | 0 | 1 | |
| T2' | 1 | 1 | 0 | 0 | 1 | |

|  | P1 | P2 | P3 | N1 | N2 | N3 |
|---|---|---|---|---|---|---|
| STATE 1 | ON | ON | ON | OFF | OFF | OFF |
| STATE 2 | ON | ON | OFF | ON | OFF | OFF |
| STATE 3 | ON | OFF | OFF | ON | OFF | ON |
| STATE 4 | OFF | OFF | OFF | ON | ON | ON |
| STATE 5 | OFF | OFF | ON | OFF | ON | ON |
| STATE 6 | ON | OFF | ON | OFF | OFF | ON |
| STATE 1' | ON | ON | ON | OFF | OFF | OFF |

CLOCK GENERATION CIRCUIT AND IMAGING DEVICE

BACKGROUND OF THE INVENTION

1. Technical Field

The present invention relates to a clock generation circuit generating an output clock in accordance with an input clock state and an imaging device including the clock generation circuit.

Priority is claimed on Japanese Patent Application No. 2011-087533, filed Apr. 11, 2011 and Japanese Patent Application No. 2012-086424, filed Apr. 5, 2012, the content of which is incorporated herein by reference.

2. Background Art

For example, an imaging device configured to capture a high-resolution image at high speed is disclosed in Japanese Unexamined Patent Application, First Publication No. 2009-38781. First, the configuration and operation of the imaging device disclosed in Japanese Unexamined Patent Application, First Publication No. 2009-38781 will be described.

FIG. 32 is a diagram illustrating an overall configuration of a (C)MOS imaging device according to the related art, as disclosed in Japanese Unexamined Patent Application, First Publication No. 2009-38781. An imaging device 1001 includes an imaging unit 1002, a vertical selection unit 1012, a read current source unit 1005, an analog unit 1006, a phase shift unit 1018, a ramp unit 1019, a column processing unit 1015, a horizontal selection unit 1014, an output unit 1017, and a control unit 1020.

In the imaging unit 1002, unit pixels 1003 including a photoelectric conversion element are arranged in a matrix form. The imaging unit 1002 generates a pixel signal corresponding to the amount of an incident electromagnetic wave and outputs the pixel signal to a vertical signal line 1013 installed in each column. When the respective unit pixels 1003 of the imaging unit 1002 are driven, the vertical selection unit 1012 controls a row address or row scanning of the imaging unit 1002 via row control lines 1011. The read current source unit 1005 is a current source that reads the pixel signal from the imaging unit 1002 as a voltage signal. The analog unit 1006 performs amplification or the like, as necessary.

The phase shift unit 1018 is configured by, for example, a delay circuit or the like in which a plurality of delay units (inversion elements) are connected to each other. The phase shift unit 1018 outputs multi-phase clocks (CK0 to CK7) having a constant phase difference from each of the plurality of delay units. The ramp unit 1019 generates a reference signal (ramp wave) increasing or decreasing over time. The column processing unit 1015 includes column AD conversion units 1016 each installed in each column of the imaging unit 1002. The column AD conversion unit 1016 converts an analog pixel signal output for each column from each unit pixel 1003 of the imaging unit 1002 into digital data.

The horizontal selection unit 1014 controls a column address or column scanning of each column AD conversion unit 1016 in the column processing unit 1015. Accordingly, the AD-converted digital data is output sequentially to the output unit 1017 via a horizontal signal line. The control unit 1020 controls each unit of the vertical selection unit 1012, the read current source unit 1005, the analog unit 1006, the phase shift unit 1018, the ramp unit 1019, the column processing unit 1015, the horizontal selection unit 1014, the output unit 1017, and the like.

Next, the configuration of the column AD conversion unit 1016 will be described. The column AD conversion units 1016 each include the same configuration. Each column AD conversion unit 1016 includes a comparison unit 1108, a low-order latch unit 1105, and a column count unit 1103.

The comparison unit 1108 compares an analog pixel signal output from the unit pixel 1003 of the imaging unit 1002 via the vertical signal line 1013 with a reference signal supplied from the ramp unit 1019. When the reference signal is greater than the pixel signal, the comparison unit 1108 outputs a high level (H level). On the other hand, when the reference signal is less than the pixel signal, the comparison unit 1108 outputs a low level (L level). The low-order latch unit 1105 is configured by a plurality of latch circuits. The low-order latch unit 1105 receives a comparison output of the comparison unit 1108 and latches (retains/stores), as the low-order data signal, logic states (low-order phase signals) of the multi-phase clocks (CK0 to CK7), which have a constant phase difference and are output from the phase shift unit 1018, at an inversion timing at which the comparison output is inversed.

The column count unit 1103 is configured by a counter circuit. The column count unit 1103 counts the clock CK7 output from the phase shift unit 1018 as a count clock and obtains a high-order data signal as the count result. Further, the column count unit 1103 obtains digital data corresponding to the magnitude of the pixel signal based on a low-order data signal forming low-order bits and a high-order data signal forming high-order bits.

To achieve synchronization between the high-order bits and the low-order bits, the imaging device inputs one (CK7) of the clocks from the phase shift unit 1018 into the column count unit 1103 via the latch circuits of the low-order latch unit 1105 and uses the clock CK7 as a count clock of the column count unit 1103. That is, when the low-order latch unit 1105 retains the low-order data signal, a change in the clock CK7 output to the column count unit 1103 stops, and thus the column count unit 1103 stops the count process.

A configuration in which a Schmitt trigger circuit is provided between a latch circuit and a counter circuit is disclosed in "Meta-Stability Characteristic of Single-Slope ADC with Time to Digital Convertor for CMOS-Image Sensor", IEICE Technical Report, by Mhun Shin, Masayuki IKEBE, Junichi MOTOHISA, and Eiichi SANO.

A through-current flowing in a Schmitt trigger circuit is greater than a through-current of a general logic circuit (for example, an inverter circuit). The Schmitt trigger circuit is a kind of feedback circuit. A plurality of passes are formed for a long time in which the through-current flows in accordance with transition (to a ground from a power source) of an input clock. Further, there is a pass in which a larger through-current instantaneously flows. In a case in which the Schmitt trigger circuit is applied to an imaging device, a large direct electric current flows and therefore voltage drop occurs, for example, when the states of latch circuits are changed simultaneously in thousands of columns.

Hereinafter, a case in which a large through-current flows in the Schmitt trigger circuit will be described. FIGS. 33A and 33B are diagrams illustrating an example of the configuration of the Schmitt trigger circuit. The Schmitt trigger circuit shown in FIGS. 33A and 33B includes transistors M1, M2, and M3, which are PMOS transistors, and transistors M4, M5, and M6, which are NMOS transistors.

FIG. 33A shows a through-current flowing when an input voltage $V_{IN}$ is changed from an L state to an H state. When the input voltage $V_{IN}$ is in the L state, the transistors M1, M3, and M5 are in an ON state and the transistors M2, M4, and M6 are in an OFF state. Further, a voltage V1 input into the gates of the transistors M2 and M5 is in the H state and an output voltage $V_{OUT}$ is in the L state.

When the input voltage $V_{IN}$ is changed from the L state to the H state, the transistor M1 is changed from the ON state to the OFF state and the transistor M6 is changed from the OFF state to the ON state. When the transistors M1 and M6 are in a substantially intermediate state of the ON state and the OFF state, a through-current I1 flows via the transistors M1 and M6. There is a delay time in which the change in the voltage V1 propagates to the output voltage $V_{OUT}$. Therefore, when the through-current I1 flows, the transistor M3 is in the ON state and a through-current I2 flows via the transistors M3 and M6.

The change in the states of the transistors M1 and M6 causes the voltage V1 to be changed from the H state to the L state. For this reason, the transistor M2 is changed from the OFF state to the ON state and the transistor M5 is changed from the ON state to the OFF state. When the transistors M2 and M5 are in a substantially intermediate state of the ON state and the OFF state, a through-current I3 flows via the transistors M2 and M5.

The change in the states of the transistors M2 and M5 causes the output voltage $V_{OUT}$ to be changed from the L state to the H state. For this reason, the transistor M3 is changed from the ON state to the OFF state and the transistor M4 is changed from the OFF state to the ON state. When the transistors M3 and M4 are in a substantially intermediate state of the ON state and the OFF state, a through-current I4 flows via the transistors M3 and M4.

Of the through-currents described above, it is easy for the through-current I2 to be larger than the other through-currents, since the through-current I2 flows in the state where the transistor M3 is in the ON state.

FIG. 33B shows a through-current flowing when an input voltage $V_{IN}$ is changed from an H state to an L state. When the input voltage $V_{IN}$ is in the H state, the transistors M2, M4, and M6 are in an ON state and the transistors M1, M3, and M5 are in an OFF state. Further, the voltage V1 input into the gates of the transistors M2 and M5 is in the L state and an output voltage $V_{OUT}$ is in the H state.

When the input voltage $V_{IN}$ is changed from the H state to the L state, the transistor M1 is changed from the OFF state to the ON state and the transistor M6 is changed from the ON state to the OFF state. When the transistors M1 and M6 are in a substantially intermediate state of the ON state and the OFF state, a through-current I1 flows via the transistors M1 and M6. There is a delay time in which the change in the voltage V1 propagates to the output voltage $V_{OUT}$. Therefore, when the through-current I1 flows, the transistor M4 is in the ON state and the through-current I2 flows via the transistors M1 and M4.

The change in the states of the transistors M1 and M6 causes the voltage V1 to be changed from the L state to the H state. For this reason, the transistor M2 is changed from the ON state to the OFF state and the transistor M5 is changed from the OFF state to the ON state. When the transistors M2 and M5 are in a substantially intermediate state of the ON state and the OFF state, the through-current I2 flows via the transistors M2 and M5.

The change in the states of the transistors M2 and M5 causes the output voltage $V_{OUT}$ to be changed from the H state to the L state. For this reason, the transistor M3 is changed from the OFF state to the ON state and the transistor M4 is changed from the ON state to the OFF state. When the transistors M3 and M4 are in a substantially intermediate state of the ON state and the OFF state, the through-current I4 flows via the transistors M3 and M4.

Of the through-currents described above, it is easy for the through-current I2 to be larger than the other through-currents, since the through-current I2 flows in the state in which the transistor M4 is in the ON state.

SUMMARY OF INVENTION

According to a first aspect of the invention, a clock generation circuit generating an output clock in accordance with a state of an input clock includes: a first logic circuit that has a first circuit threshold value lower than a circuit threshold value of a front-stage circuit outputting a voltage having a logic state corresponding to the circuit threshold value as the first input clock, receives the first input clock output from the front-stage circuit, and outputs a first output signal in accordance with a logic state of the first input clock and the first circuit threshold value, a second logic circuit that has a second circuit threshold value higher than the circuit threshold value of the front-stage circuit, receives the first input clock output from the front-stage circuit, and outputs a second output signal in accordance with the logic state of the first input clock and the second circuit threshold value, and a switch circuit that receives the first and second output signals and outputs, as the output clock, any one of first and second voltages corresponding to different logic states of the first and second output signals when logic states of the first and second output signals are changed from the different logic states to the same logic state.

The first and second logic circuits may be inverter circuits.

The switch circuit may include a first transistor which includes first and second terminals and a first control terminal and in which, between the third and fourth voltages corresponding to the different logic states, the third voltage is connected to the first terminal and the first output signal is connected to the first control terminal, a second transistor which includes third and fourth terminals and a second control terminal and in which the second terminal is connected to the third terminal, an output terminal outputting one of the third and fourth voltages is connected to the fourth terminal, and the second output signal is connected to the second control terminal, a third transistor which includes fifth and sixth terminals and a third control terminal and in which the output terminal is connected to the fifth terminal and the first output signal is connected to the third control terminal and a fourth transistor which includes seventh and eighth terminals and a fourth control terminal and in which the sixth terminal is connected to the seventh terminal, the fourth voltage is connected to the eighth terminal, and the second output signal is connected to the fourth control terminal.

When the first output signal is in a high state, the first transistor may be turned off and the third transistor may be turned on. When the first output signal is in a low state, the first transistor may be turned on and the third transistor may be turned off. When the second output signal is in the high state, the second transistor may be turned off and the fourth transistor may be turned on. When the second output signal is in the low state, the second transistor may be turned on and the fourth transistor may be turned off.

The first and second output signals may be input to the switch circuit and a second input clock having a phase reverse to a phase of the first input clock and being advanced by a predetermined time from the first input clock is also input to the switch circuit. When different logic states of the first and second output signals are at least changed to the same logic state of the first output signal, the second output signal and the second input clock, the switch circuit may output, as the output clock, a voltage having a logic state reverse to the second input clock of the first and second voltages corresponding to the different logic state.

The switch circuit may include first and second switch circuits. The first and second output signals may be input to the first switch circuit. The second input signal may be input to the second switch circuit. A threshold value of the second switch circuit may be higher than the first circuit threshold value and may be lower than the second circuit threshold value.

The first switch circuit may include a first, a second, a third and a fourth transistors. The first transistor may include a first terminal, a second terminal, and a first control terminal and in which, of third and fourth voltages corresponding to the different logic states, the third voltage is connected to the first terminal and the first output signal is connected to the first control terminal. The second transistor may include a third terminal, a fourth terminal, and a second control terminal and in which the second terminal is connected to the third terminal and the second output signal is connected to the second control terminal. The third transistor may include a fifth terminal, a sixth terminal, and a third control terminal and in which the first output signal is connected to the third control terminal. The fourth transistor may include a seventh terminal, an eighth terminal, and a fourth control terminal and in which the sixth terminal is connected to the seventh terminal, the fourth voltage is connected to the eighth terminal, and the second output signal is connected to the fourth control terminal. The second switch circuit may include a fifth and a sixth transistors. The fifth transistor may include a ninth terminal, a tenth terminal, and a fifth control terminal and in which the ninth terminal is connected to the fourth terminal, the tenth terminal is connected to an output terminal outputting one of the third and fourth voltages, and the second input signal is input to the fifth control terminal. The sixth transistor may include an eleventh terminal, a twelfth terminal, and a sixth control terminal and in which the eleventh terminal is connected to the output terminal, the twelfth terminal is connected to the fifth terminal, and the second input signal is input to the sixth control terminal.

When the first output signal is in a high state, the first transistor may be turned off and the third transistor turned on. When the first output signal is in a low state, the first transistor may be turned on and the third transistor turned off. When the second output signal is in the high state, the second transistor may be turned off and the fourth transistor turned on. When the second output signal in the low state, the second transistor may be turned on and the fourth transistor turned off. When the second input clock is in the high state, the fifth transistor may be turned off and the sixth transistor turned on. When the second input clock is in the low state, the fifth transistor may be turned on and the sixth transistor turned off.

According to a second aspect of the invention, an imaging device includes an imaging unit and an AD conversion unit. The imaging unit includes a plurality of pixels each including a photoelectric conversion element, the plurality of pixels outputting a first pixel signal in accordance with a reset level during a first time and outputting a second pixel signal in accordance with an amount of an incident electromagnetic wave during a second time. The AD conversion unit outputs a first digital value corresponding to the first pixel signal and a second digital value corresponding to a second pixel signal. The AD conversion unit includes a reference signal generation circuit, a comparison circuit, a delay unit, a latch unit, a clock generation circuit and a counter circuit. The reference signal generation circuit generates a reference signal increasing or decreasing over time. The comparison circuit compares a pixel signal, which is output from the pixel and is AD-converted, to the reference signal and ends the comparison process at a timing at which the reference signal satisfies a predetermined condition with respect to the pixel signal. The delay circuit includes a plurality of delay elements, which are connected to each other and delay a pulse signal, and outputs low-order phase signals formed by output signals output from the plurality of delay elements. The latch circuit latches the low-order phase signals at a timing associated with the end of the comparison process the clock generation circuit to which one of the output signals constituting the low-order phase signals output from the delay circuit is input as the input clock. The counter circuit counts an output clock output from the clock generation circuit as a count clock.

According to a third aspect of the invention, an imaging device includes an imaging unit and an AD conversion unit. The imaging unit includes a plurality of pixels each including a photoelectric conversion element, the plurality of pixels outputting a first pixel signal in accordance with a reset level during a first time and outputting a second pixel signal in accordance with an amount of an incident electromagnetic wave during a second time. The AD conversion unit outputs a first digital value corresponding to the first pixel signal and a second digital value corresponding to the second pixel signal. The AD conversion unit includes a reference signal generation circuit, a comparison circuit, a delay circuit, a latch circuit, a clock generation circuit and a counter circuit. The reference signal generation circuit generates a reference signal increasing or decreasing over time. The comparison circuit compares a pixel signal, which is output from the pixel and is subjected to AD conversion, to the reference signal and ends the comparison process at a timing at which the reference signal satisfies a predetermined condition with respect to the pixel signal. The delay circuit includes a plurality of delay elements, which are connected to each other and delay a pulse signal, and outputs low-order phase signals formed by output signals output from the plurality of delay elements. The latch circuit latches the low-order phase signals at a timing associated with the end of the comparison process. the clock generation circuit to which two of the output signals constituting the low-order phase signals output from the delay circuit are input as the first and second input clocks. The counter circuit counts the output clock output from the clock generation circuit as a count clock.

BRIEF DESCRIPTION OF THE DRAWINGS

FIG. 4 is a truth value table illustrating the process of the clock generation circuit according to the first embodiment of the invention.

FIG. 5 is a reference diagram illustrating the states of resistors of a switch according to the first embodiment of the invention.

FIG. 16 is a truth value table illustrating the process of the clock generation circuit according to the first embodiment of the invention.

DETAILED DESCRIPTION OF THE INVENTION

Hereinafter, embodiments of the invention will be described with reference to the drawings.

First Embodiment

Figure 1A:
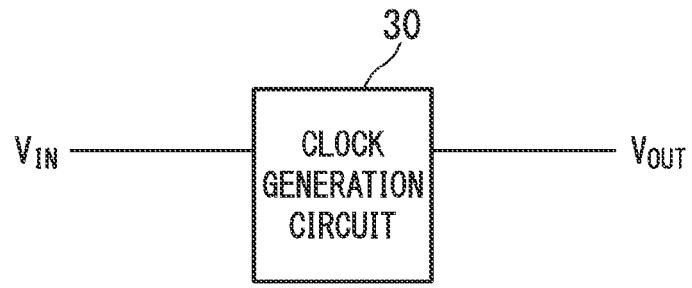
FIG. 1A is a diagram illustrating the configuration of a clock generation circuit according to a first embodiment of the invention.
Figure 1B:
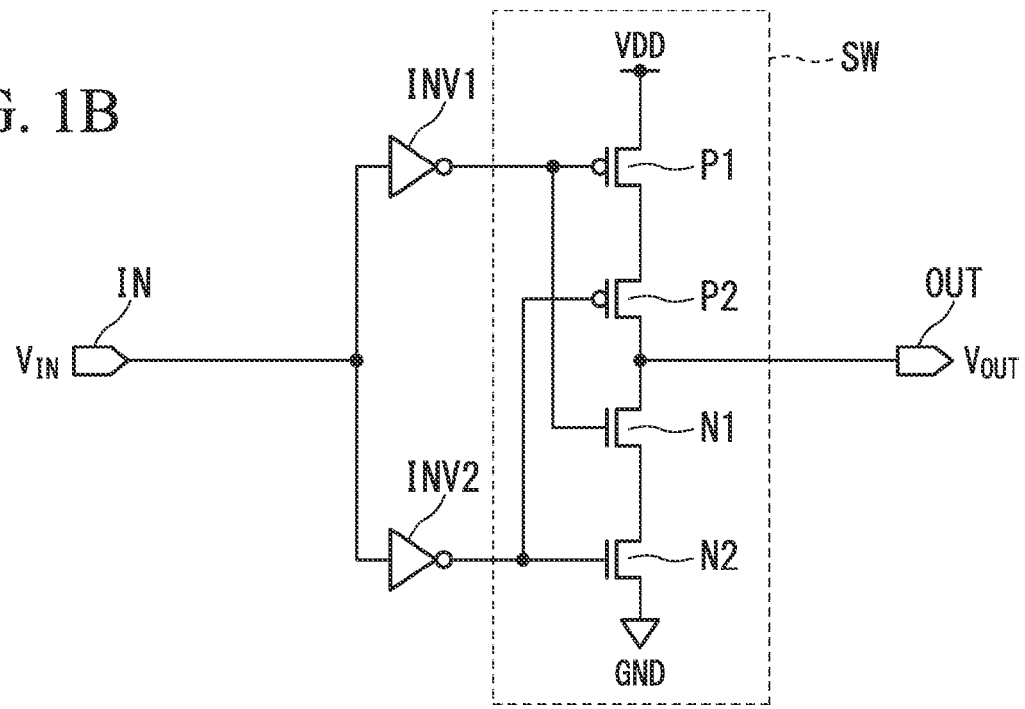
FIG. 1B is a diagram illustrating the configuration of the clock generation circuit according to the first embodiment of the invention.

First, a first embodiment of the invention will be described. FIGS. 1A and 1B are diagrams illustrating an example of the configuration of a clock generation circuit according to this embodiment. Hereinafter, the configuration of the clock generation circuit according to this embodiment will be described. A clock generation circuit 30 shown in FIG. 1A outputs a clock (output clock) as an output voltage $V_{OUT}$ in accordance with a clock (input clock) input as input voltage $V_{IN}$ from a front-stage circuit (for example, an inverter circuit) outputting a voltage having a logic state in accordance with a circuit threshold value.

FIG. 1B shows an example of the detailed configuration of the clock generation circuit 30. As shown in FIG. 1B, the clock generation circuit 30 includes an input terminal IN, an output terminal OUT, inverter circuits INV1 and INV2, and a switch circuit SW. The switch circuit SW includes transistors P1 and P2, which are PMOS transistors, and transistors N1 and N2, which are NMOS transistors.

One end of the inverter circuit INV1 (first logic circuit) is connected to the input terminal IN and the other end of the inverter circuit INV1 is connected to the gates (first and third control terminals) of the transistors P1 and N1. The inverter circuit INV1 has a first circuit threshold value lower than the circuit threshold value of the front-stage circuit and outputs a signal (first output signal) corresponding to a comparison result obtained by comparing the logic state of a clock input to the input terminal IN to the first circuit threshold value. One end of the inverter circuit INV2 (second logic circuit) is connected to the input terminal IN and the other end of the inverter circuit INV2 is connected to the gates (second and fourth control terminals) of the transistors P2 and N2. The inverter circuit INV2 has a second circuit threshold value higher than the circuit threshold value of the front-stage circuit and outputs a signal (second output signal) corresponding to a comparison result obtained by comparing the logic state of the clock input to the input terminal IN to the second circuit threshold value.

The switch circuit SW is configured to output a clock in an H state (first voltage) or an L state (second voltage) when the respective logic states of two signals output from the inverter circuits INV1 and INV2 are changed from different logic states (the H and L states or the L and H states) to the same logic state (the H and H states or the L and L states). The transistors P1, P2, N1, and N2 of the switch circuit SW are connected to each other as follows.

A source terminal (first terminal) of the transistor P1 (first transistor) is connected to a power-supply voltage VDD (third voltage). A source terminal (third terminal) of the transistor P2 (second transistor) is connected to a drain terminal (second terminal) of the transistor P1. A drain terminal (fourth terminal) of the transistor P2 is connected to an output terminal OUT.

A drain terminal (fifth terminal) of the transistor N1 (third transistor) is connected to the output terminal OUT. A drain terminal (seventh terminal) of the transistor N2 (fourth transistor) is connected to a source terminal (sixth terminal) of the transistor N1. A source terminal (eighth terminal) of the transistor N2 is connected to a ground GND (fourth voltage).

Figure 2:
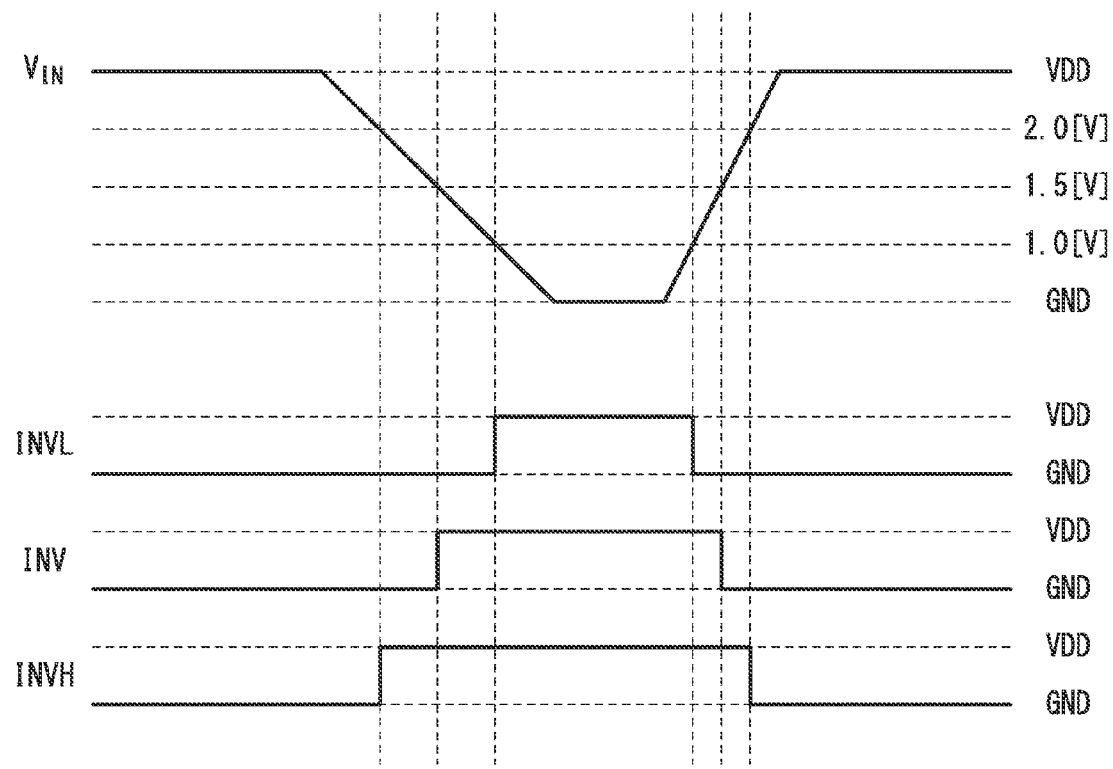
FIG. 2 is a timing chart illustrating input and output characteristics of an inverter circuit according to the first embodiment of the invention.

FIG. 2 is a diagram illustrating the input and output characteristic of the inverter circuits INV1 and INV2. Here, the description will be made on the assumption that the circuit threshold value of the inverter circuit INV1 is 1.0 [V] and the circuit threshold value of the inverter circuit INV2 is 2.0 [V].

FIG. 2 shows the input voltage $V_{IN}$ input into each inverter circuit, an output voltage INVL of the inverter circuit INV1, and an output voltage INVH of the inverter circuit INV2. For comparison, an output voltage INV of an inverter circuit supposed as the front-stage circuit of the clock generation circuit 30 is also shown in FIG. 2.

The description will be made on the assumption that the circuit threshold value of the inverter circuit is 1.5 [V].

When the input voltage $V_{IN}$ falls from the power-supply voltage VDD to the ground GND, the output voltage INVH of the inverter circuit INV2 is first changed from the L state to the H state. Next, the output voltage INV of the inverter circuit, which is the front-stage circuit, is changed from the L state to the H state. Finally, the output voltage INVL of the inverter circuit INV1 is changed from the L state to the H state. On the other hand, when the input voltage $V_{IN}$ rises from the ground GND to the power-supply voltage VDD, the output voltage INVL of the inverter circuit INV1 is first changed from the H state to the L state. Next, the output voltage INV of the inverter circuit, which is the front-stage circuit, is changed from the H state to the L state. Finally, the output voltage INVH of the inverter circuit INV2 is changed from the H state to the L state. Further, the circuit threshold value may be easily adjusted by the size or threshold value of the transistor used in the logic circuit.

Figure 3:
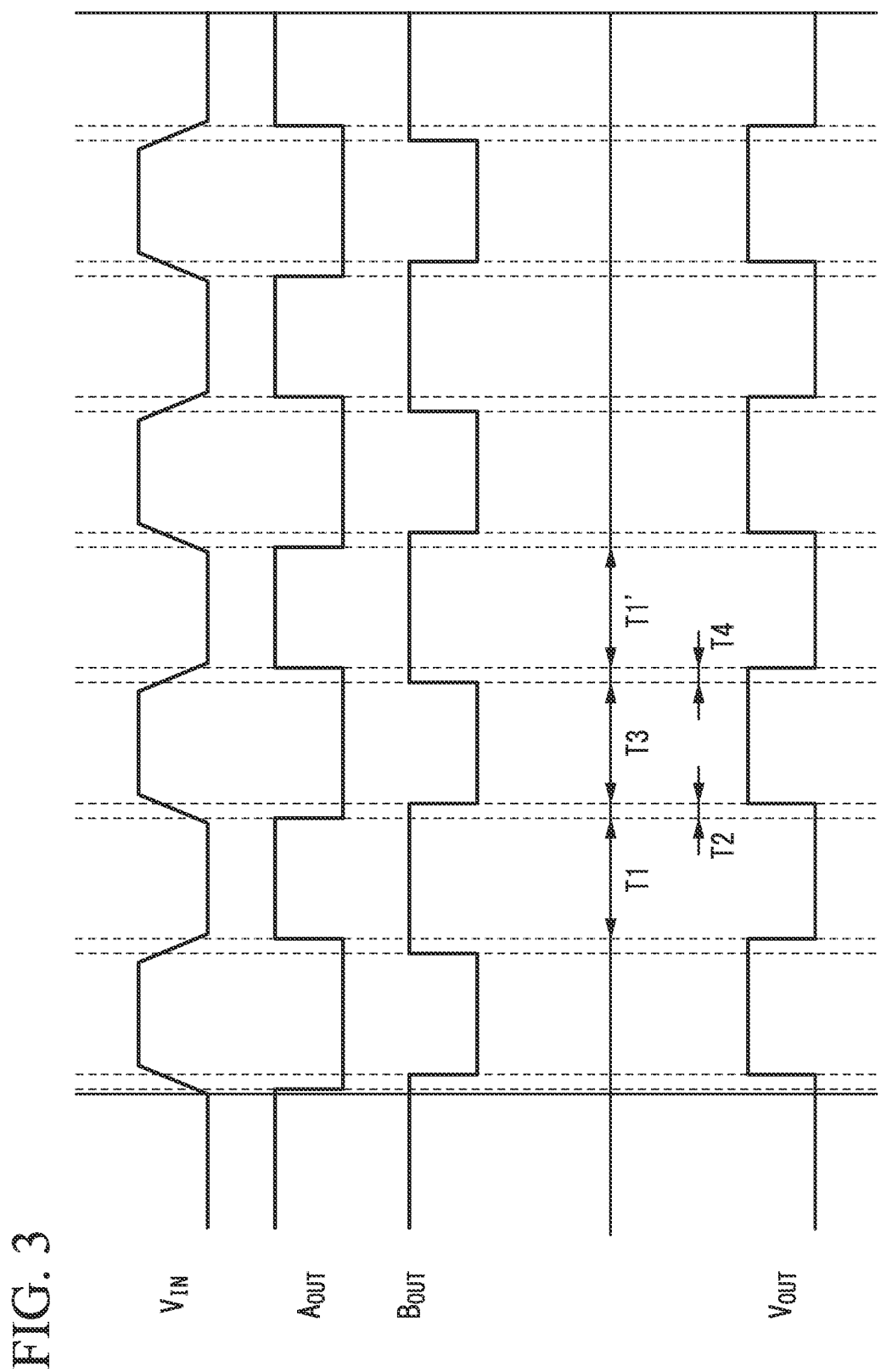
FIG. 3 is a timing chart illustrating a process of the clock generation circuit according to the first embodiment of the invention.

Next, a process of the clock generation circuit 30 will be described. FIG. 3 shows the waveforms of the input voltage $V_{IN}$ input into the input terminal IN of the clock generation circuit 30, an output voltage $A_{OUT}$ of the inverter circuit INV1, an output voltage $B_{OUT}$ of the inverter circuit INV2, and the output voltage $V_{OUT}$ output from the output terminal OUT of the clock generation circuit 30. FIG. 4 shows the respective logic values of the input voltage $V_{IN}$, the output voltage $A_{OUT}$, the output voltage $B_{OUT}$, and the output voltage $V_{OUT}$. In FIG. 4, "0" corresponds to the L state and "1" corresponds to the H state.

Since the input voltage $V_{IN}$ is lower than the circuit threshold value of the inverter circuit INV1 and the circuit threshold value of the inverter circuit INV2 during a period T1 of FIG. 3, the inverter circuits INV1 and INV2 determine that the logic state of the input voltage $V_{IN}$ is the L state (logic value "0"). Therefore, the output voltages $A_{OUT}$ and $B_{OUT}$ become the H state (logic value "1"). In this state, since the transistors P1 and P2 are turned off and the transistors N1 and N2 are turned on, the output voltage $V_{OUT}$ becomes the L state (logic state "0").

Since the input voltage $V_{IN}$ is higher than the circuit threshold value of the inverter circuit INV1 and is lower than the circuit threshold value of the inverter circuit INV2 during a period T2 of FIG. 3, the inverter circuit INV1 determines that the logic state of the input voltage $V_{IN}$ is the H state (logic value "1") and the inverter circuit INV2 determines that the logic state of the input voltage $V_{IN}$ is the L state (logic value "0"). Therefore, the output voltage $A_{OUT}$ becomes the L state (logic value "0") and the output voltage $B_{OUT}$ becomes the H state (logic value "1"). In this state, since the transistors P2 and N1 are turned off and the transistors P1 and N2 are turned on, the output voltage $V_{OUT}$ retains the L state (logic value "0") which is the previous state.

Since the input voltage $V_{IN}$ is higher than the circuit threshold values of the inverter circuits INV1 and INV2 during a period T3 of FIG. 3, the inverter circuits INV1 and INV2 determine that the logic state of the input voltage $V_{IN}$ is the H state (logic value "1"). Therefore, the output voltages $A_{OUT}$ and $B_{OUT}$ become the L state (logic value "0"). In this state, since the transistors N1 and N2 are turned off and the transistors P1 and P2 are turned on, the output voltage $V_{OUT}$ becomes the H state (logic value "1").

Since the input voltage $V_{IN}$ is higher than the circuit threshold value of the inverter circuit INV1 and is lower than the circuit threshold value of the inverter circuit INV2 during a period T4 of FIG. 3, the inverter circuit INV1 determines that the logic state of the input voltage $V_{IN}$ is the H state (logic value "1") and the inverter circuit INV2 determines that the logic state of the input voltage $V_{IN}$ is the L state (logic value "0"). Therefore, the output voltage $A_{OUT}$ becomes the L state (logic value "0") and the output voltage $B_{OUT}$ becomes the H state (logic value "1"). In this state, since the transistors P2 and N1 are turned off and the transistors P1 and N2 are turned on, the output voltage $V_{OUT}$ retains the H state (logic value "1") which is the previous state.

The circuit state during a period T1' of FIG. 3 is the same as the circuit state during the period T1. In this state, since the transistors P1 and P2 are turned off and the transistors N1 and N2 are turned on, the output voltage $V_{OUT}$ becomes the L state (logic value "0"). A process during a period subsequent to the period T1' is the same as the process during the period T2. The same processes are repeated in accordance with the change in the input voltage $V_{IN}$ using the above-described processes during the periods T1 to T4 as a unit.

As shown in FIG. 4, the output voltage $V_{OUT}$ is changed only when both logic states of the output voltage $A_{OUT}$ of the inverter circuit INV1 and the output voltage $B_{OUT}$ of the inverter circuit INV2 are changed from different states to the same state. In FIG. 4, the output voltage $V_{OUT}$ is changed between the periods T2 and T3 and between the periods T4 and T1'. During a period immediately before the change in the output voltage $V_{OUT}$, the logic state of the output voltage $A_{OUT}$ of the inverter circuit INV1 is different from that of the output voltage $B_{OUT}$ of the inverter circuit INV2. During a period immediately after the change in the output voltage $V_{OUT}$, the logic state of the output voltage $A_{OUT}$ of the inverter circuit INV1 is the same as that of the output voltage $B_{OUT}$ of the inverter circuit INV2.

Even when a Meta-Stable state occurs in the front-stage circuit, the output voltage $V_{OUT}$ is not changed as long as both inverter circuits INV1 and INV2, which are the rear-stage circuits, do not determine that the logic state of the input voltage $V_{IN}$ is the H state or the L state. This means that no false clock is generated even when the Meta-Stable state occurs in the front-stage circuit.

FIG. 5 shows the states of the transistors P1, P2, N1, and N2 during the periods T1 to T1' of FIG. 3.

In FIG. 5, states 1 to 1' correspond to the periods T1 to T1' of FIG. 3, respectively.

As shown in FIG. 5, when the state of each transistor is changed from state 1 to state 2, the transistor P2 is in the OFF state. Further, when the state of each transistor is changed from state 2 to state 3 and the state of each transistor is changed from state 3 to state 4, the transistor N1 is in the OFF state. Furthermore, when the state of each transistor is changed from state 4 to state 1', the transistor P2 is in the OFF state. In this way, when the state of each transistor is changed, any one of the transistors is necessarily in the OFF state. Accordingly, a pass in which a through-current flows via the four transistors is not formed in the switch circuit SW according to this embodiment.

According to this embodiment, as described above, the clock generation circuit realizes the same function as the Schmitt trigger and may reduce the through-current compared to the Schmitt trigger circuit. Thus, the generation of the false clock may be reduced. Further, since the front-stage logic circuit of the switch circuit SW is configured by the inverter circuit, the circuit can be easily configured.

In the configuration shown in FIGS. 1A and 1B, an erroneous process of a rear-stage circuit caused due to a change in the output voltage $V_{OUT}$ may be reduced. Hereinafter, the effect of reducing the erroneous process of the rear-stage circuit caused due to the change in the output voltage $V_{OUT}$ will be described.

Figure 6:
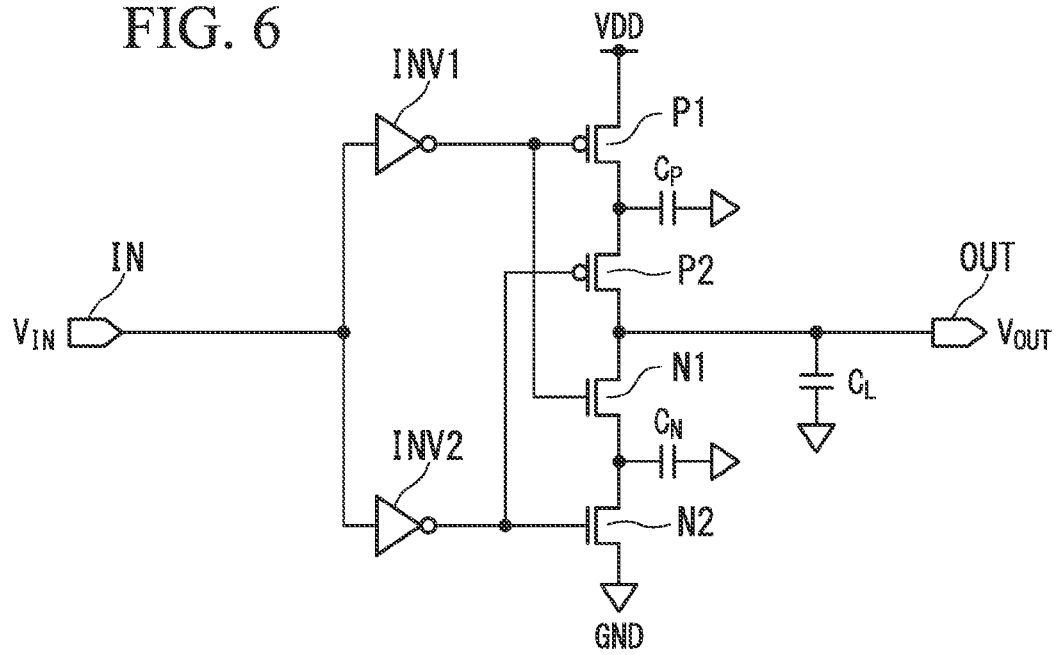
FIG. 6 is a circuit diagram illustrating the clock generation circuit according to the first embodiment of the invention.

FIG. 6 is a diagram illustrating the configuration of the clock generation circuit 30 according to this embodiment. FIG. 6 shows parasitic capacitances $C_L$, $C_P$, and $C_N$, which are causes of the change in the output voltage $V_{OUT}$, in the configuration shown in FIGS. 1A and 1B.

Figure 7:
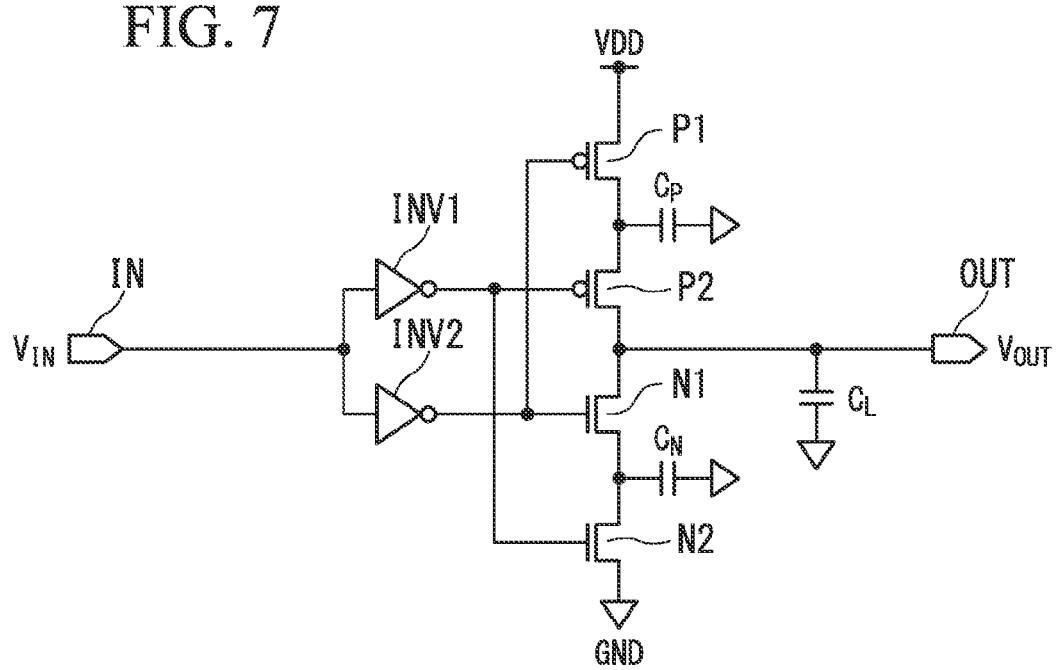
FIG. 7 is a circuit diagram illustrating the clock generation circuit according to the first embodiment of the invention.
Figure 8A:
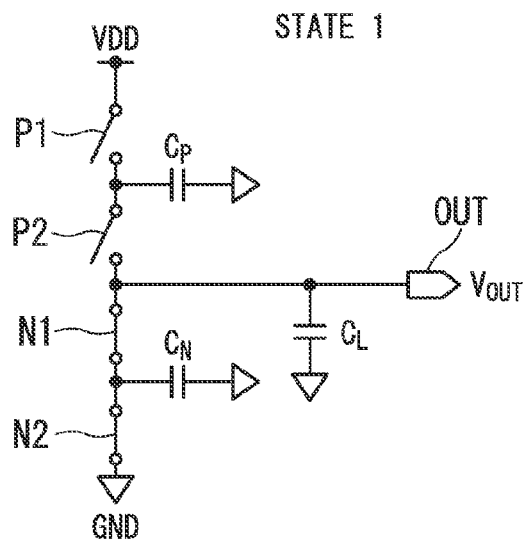
FIG. 8A is a circuit diagram illustrating a process of the clock generation circuit according to the first embodiment of the invention.
Figure 8B:
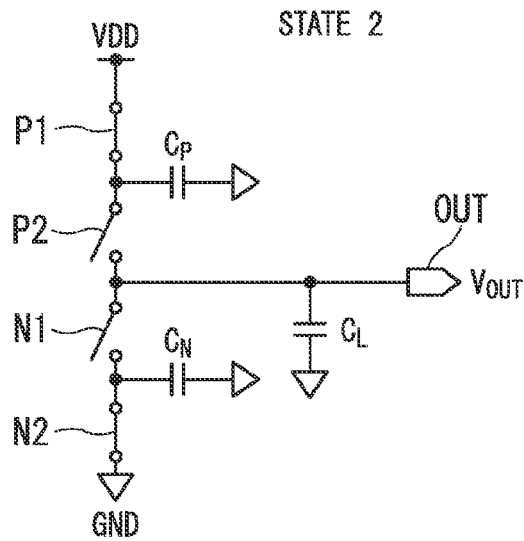
FIG. 8B is a circuit diagram illustrating a process of the clock generation circuit according to the first embodiment of the invention.
Figure 8C:
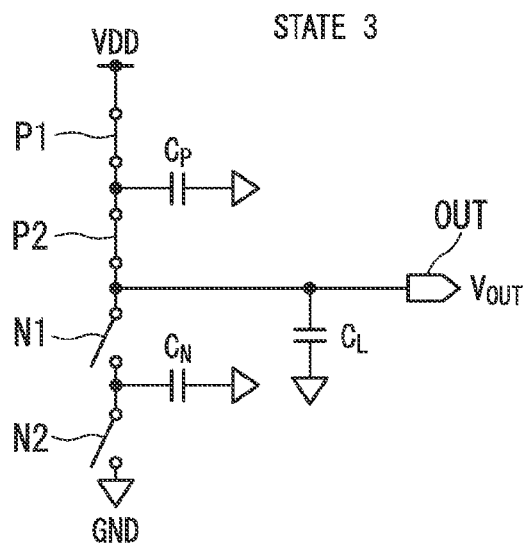
FIG. 8C is a circuit diagram illustrating a process of the clock generation circuit according to the first embodiment of the invention.
Figure 9A:
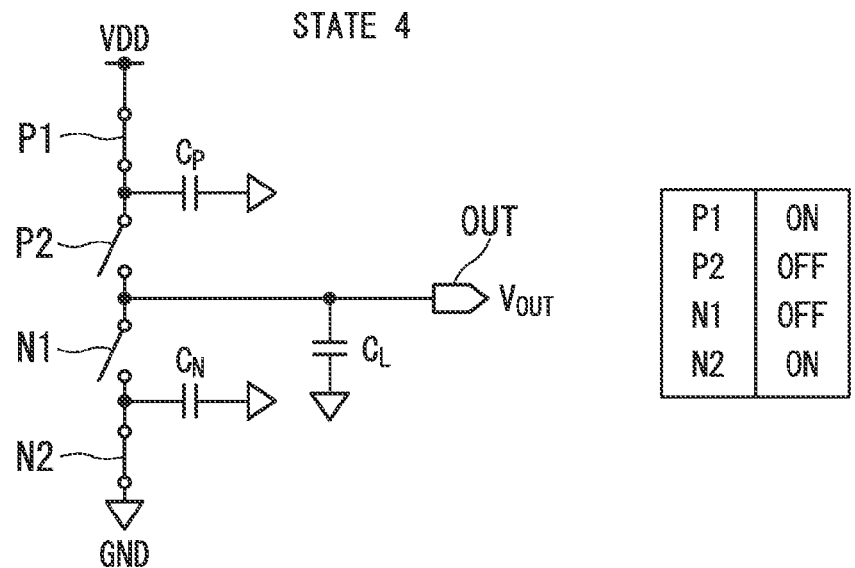
FIG. 9A is a circuit diagram illustrating a process of the clock generation circuit according to the first embodiment of the invention.
Figure 9B:
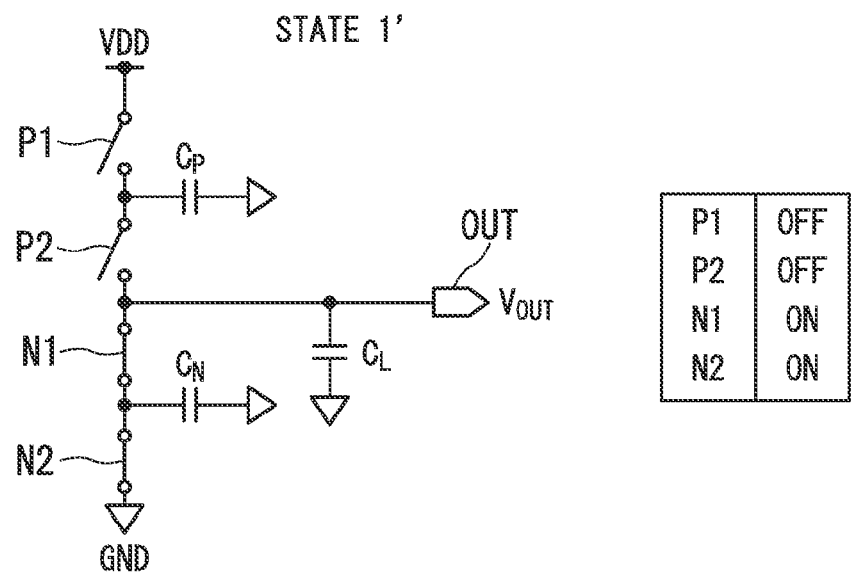
FIG. 9B is a circuit diagram illustrating a process of the clock generation circuit according to the first embodiment of the invention.
Figure 10A:
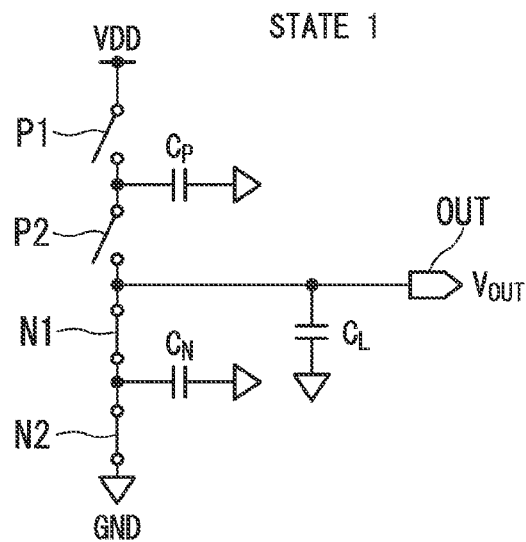
FIG. 10A is a circuit diagram illustrating a process of the clock generation circuit according to the first embodiment of the invention.
Figure 10B:
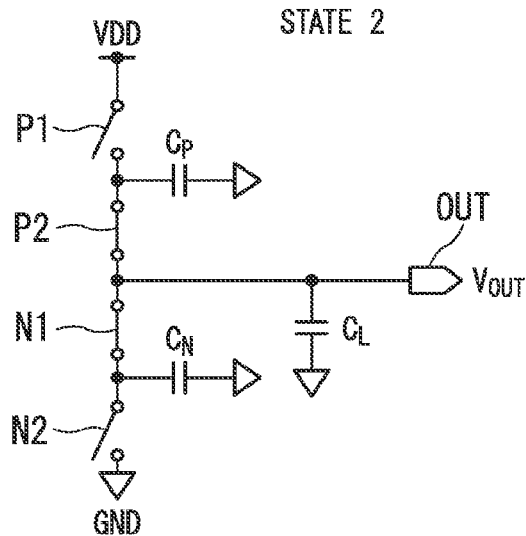
FIG. 10B is a circuit diagram illustrating a process of the clock generation circuit according to the first embodiment of the invention.
Figure 10C:
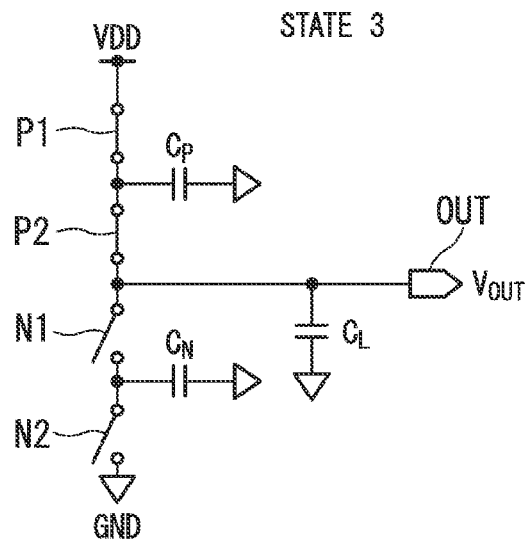
FIG. 10C is a circuit diagram illustrating a process of the clock generation circuit according to the first embodiment of the invention.
Figure 11A:
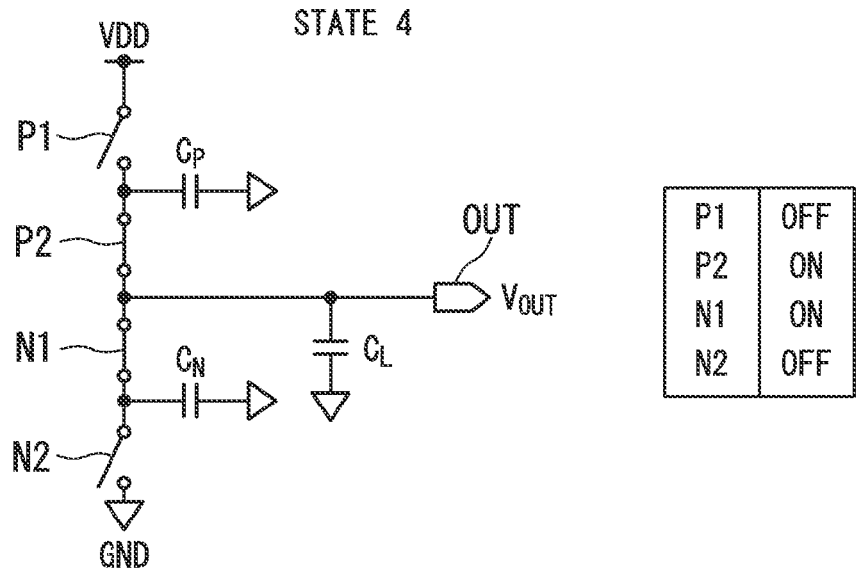
FIG. 11A is a circuit diagram illustrating a process of the clock generation circuit according to the first embodiment of the invention.
Figure 11B:
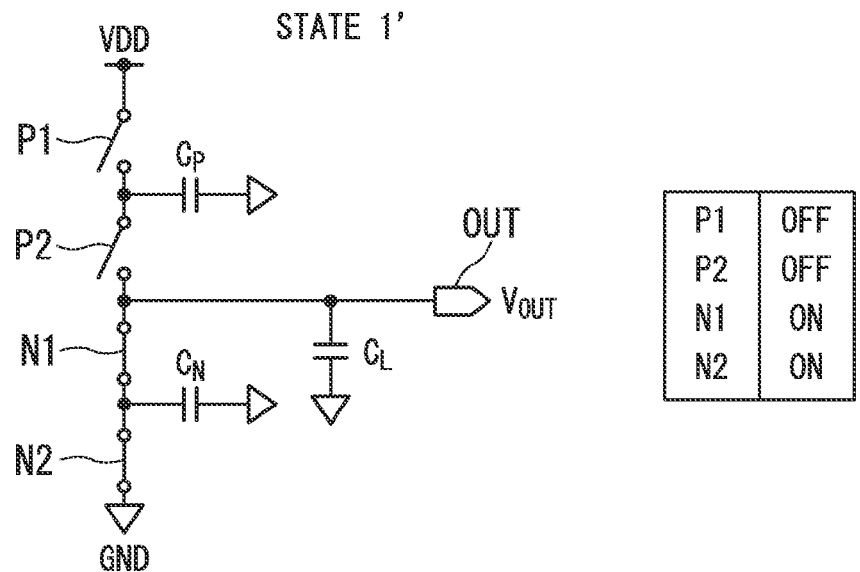
FIG. 11B is a circuit diagram illustrating a process of the clock generation circuit according to the first embodiment of the invention.

FIG. 7 is a diagram illustrating the configuration which is compared to the configuration shown in FIG. 6. The configuration shown in FIG. 7 is different from the configuration shown in FIG. 6 in that the other end of the inverter circuit INV1 is connected to the gates of the transistors P2 and N2 and the other end of the inverter circuit INV2 is connected to the gates of the transistors P1 and N1. The clock generation circuit having the configuration shown in FIG. 7 also realizes the same function as the Schmitt trigger circuit and may reduce the through-current compared to the Schmitt trigger circuit. Hereinafter, the effect of reducing the erroneous process of the rear-stage circuit caused due to the change in the output voltage $V_{OUT}$ will be described. A higher effect can be obtained in the configuration shown in FIG. 6 than in the configuration shown in FIG. 7.

FIGS. 8A, 8B, 8C, 9A, and 9B show the states of the transistors P1, P2, N1, and N2 during the periods T1 to T1' of FIG. 3 in the configuration shown in FIG. 6. States 1 to 1' in FIGS. 8A, 8B, 8C, 9A, and 9B correspond to the periods T1 to T1' of FIG. 3, respectively.

In state 1 (FIG. 8A), the transistors P1 and P2 are turned off and the transistors N1 and N2 are turned on.

At this time, the output voltage $V_{OUT}$ becomes the ground GND. In state 2 (FIG. 8B), the transistors P2 and N1 are turned off and the transistors P1 and N2 are turned on. At this time, since the transistors P2 and N2 connected to the output terminal OUT is in the OFF state, the output voltage $V_{OUT}$ retains the ground GND.

In state 3 (FIG. 8C), the transistors N1 and N2 are turned off and the transistors P1 and P2 are turned on.

At this time, the output voltage $V_{OUT}$ becomes the power-supply voltage VDD. Further, the parasitic capacitances $C_L$ and $C_P$ are charged by the power-supply voltage VDD. In state 4 (FIG. 9A), the transistors P2 and N1 are turned off and the transistors P1 and N2 are turned on. At this time, since the transistors P2 and N2 connected to the output terminal OUT are turned off, the output voltage $V_{OUT}$ retains the power-supply voltage VDD.

In state 1' (FIG. 9B), the transistors P1 and P2 are in the OFF state and the transistors N1 and N2 are in the ON state. At this time, the output voltage $V_{OUT}$ becomes the ground GND and the parasitic capacitance $C_L$ is discharged. In the above-described processes, in states 2 and 4, when the output voltage $V_{OUT}$ retains the previous state, the transistors P2 and N1 are in the OFF state, and the parasitic capacitances are separated from each other. Therefore, there is no change in the output voltage $V_{OUT}$ since charges accumulated in the parasitic capacitance are distributed.

FIGS. 10A, 10B, 10C, 11A, and 11B show the states of the transistors P1, P2, N1, and N2 during the periods T1 to T1' of FIG. 3 in the configuration shown in FIG. 7. States 1 to 1' in FIGS. 10A, 10B, 10C, 11A, and 11B correspond to the periods T1 to T1' of FIG. 3, respectively.

In state 1 (FIG. 10A), the transistors P1 and P2 are turned off and the transistors N1 and N2 are turned on.

At this time, the output voltage $V_{OUT}$ becomes the ground GND. In state 2 (FIG. 10B), the transistors P2 and N2 are turned off and the transistors P1 and N1 are turned on. At this time, since the parasitic capacitances $C_L$, $C_P$, and $C_N$ are connected to each other via the transistors P2 and N1, the charge accumulated in the parasitic capacitance $C_P$ is distributed to the parasitic capacitances $C_L$, $C_P$, and $C_N$, thereby causing the change in the output voltage $V_{OUT}$.

In state 3 (FIG. 10C), the transistors N1 and N2 are turned off and the transistors P1 and P2 are turned on.

At this time, the output voltage $V_{OUT}$ becomes the power-supply voltage VDD. Further, the parasitic capacitances $C_L$ and $C_P$ are charged by the power-supply voltage VDD. In state 4 (FIG. 11A), the transistors P1 and N2 are turned off and the transistors P2 and N1 are turned on. At this time, since the parasitic capacitances $C_L$, $C_P$, and $C_N$ are connected to each other via the transistors P2 and N1, the charge accumulated in the parasitic capacitances $C_L$ and $C_P$ is distributed to the parasitic capacitances $C_L$, $C_P$, and $C_N$, thereby causing the change in the output voltage $V_{OUT}$.

In state 1' (FIG. 11B), the transistors P1 and P2 are turned off and the transistors N1 and N2 are turned on. At this time, the output voltage $V_{OUT}$ becomes the ground GND and the parasitic capacitances $C_L$ and $C_N$ are discharged. In the above-described processes, since the transistors P2 and N1 are turned on in states 2 and 4 and the parasitic capacitances are connected to each other via the transistors P2 and N1, the charge accumulated in the parasitic capacitances is distributed, thereby causing the change in the output voltage $V_{OUT}$.

Thus, the erroneous process of the rear-stage circuit caused due to the change in the output voltage $V_{OUT}$ may be further reduced in the configuration shown in FIG. 6 than in the configuration shown in FIG. 7. Further, for example, the switch circuit SW excluding the transistors P1 and N2 in FIG. 6 can be considered to reduce the number of transistors to be used.

Second Embodiment

Figure 12:
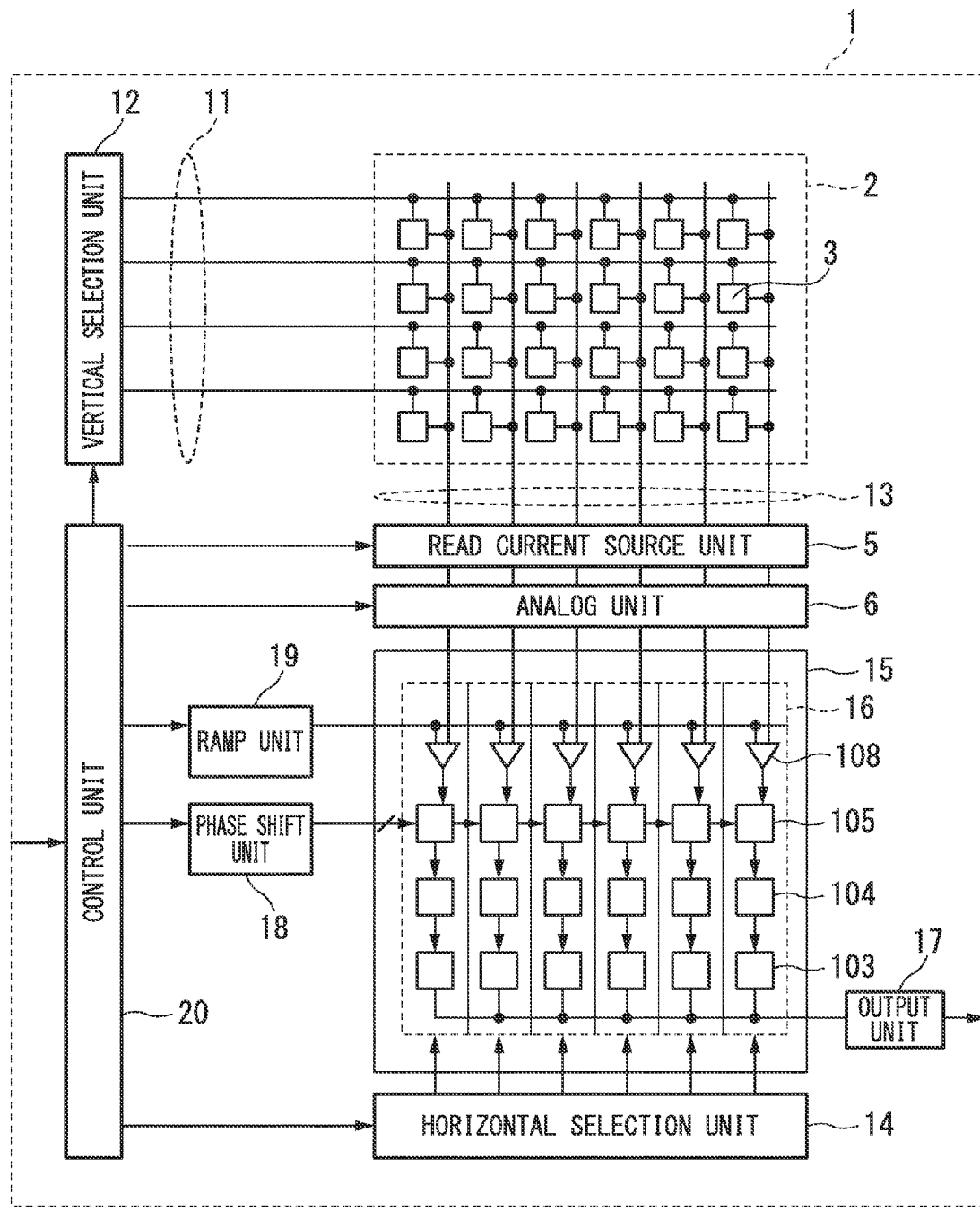
FIG. 12 is a block diagram illustrating the configuration of an imaging device according to a second embodiment of the invention.

Next, a second embodiment of the invention will be described. FIG. 12 is a diagram illustrating an example of the configuration of an imaging device according to this embodiment. An imaging device 1 shown in FIG. 12 includes an imaging unit 2, a vertical selection unit 12, a read current source unit 5, an analog unit 6, a phase shift unit 18, a ramp unit 19 (reference signal generation circuit), a column processing unit 15, a horizontal selection unit 14, an output unit 17, and a control unit 20.

In the imaging unit 2, a plurality of unit pixels 3 generating and outputting a signal corresponding to the amount of an incident electromagnetic wave are arranged in a matrix form. The vertical selection unit 12 selects each row of the imaging unit 2. The read current source unit 5 reads the signal from the imaging unit 2 as a voltage signal. The analog unit 6 will not be described in detail. The analog unit 6 includes an AGC (Auto Gain Control) circuit having a signal amplification function, as necessary. The phase shift unit 18 generates a multi-phase clock. The ramp unit 19 generates a reference signal (ramp wave) increasing or decreasing over time. The column processing unit 15 is connected to the ramp unit 19 via a reference signal line. The horizontal selection unit 14 transmits AD-converted data to the output unit 17 connected to the horizontal signal line. The control unit 20 controls each unit.

In FIG. 12, the imaging unit 2 including the unit pixels 3 of four rows by six columns is illustrated to facilitate the description. In effect, the tens to tens of thousands of unit pixels 3 are arranged in each row or each column of the imaging unit 2. Although not illustrated in the drawing, each unit pixel 3 of the imaging unit 2 includes photoelectric conversion elements such as a photodiode, a photogate, and a phototransistor and a transistor circuit.

Hereinafter, each unit will be described in more detail. In the imaging unit 2, the unit pixels 3 are arranged two-dimensionally in four rows by six columns and a row control line 11 is disposed for each row of the pixel arrangement of four rows by six columns. One end of each row control line 11 is connected to an output end corresponding to each row of the vertical selection unit 12. The vertical selection unit 12 is configured by a shift resistor, a decoder, or the like. When the respective unit pixels 3 of the imaging unit 2 are driven, the vertical selection unit 12 controls a row address or row scanning of the imaging unit 2 via the row control line 11. A vertical signal line 13 is disposed for each column of the pixel arrangement of the imaging unit 2.

The read current source unit 5 is configured by a current source for reading the signal from the imaging unit 2 as a voltage signal.

The column processing unit 15 includes a column AD conversion unit 16 installed in each pixel column of the imaging unit 2, that is, the vertical signal line 13, and converts an analog pixel signal, which is read for each pixel column from each unit pixel 3 of the imaging unit 2 via the vertical signal line 13, into digital data. In this example, the column AD conversion unit 16 is installed so as to have a one-to-one arrangement relation with the pixel column of the imaging unit 2. However, this configuration is just an example and the invention is not limited to this arrangement relation. For example, one column AD conversion unit 16 may be installed for the plurality of pixel columns and the one column AD conversion unit 16 may be used in a time division manner between the plurality of pixel columns. Along with the ramp unit 19 and the phase shift unit 18 to be described below, the column processing unit 15 forms analog-to-digital conversion means for converting an analog pixel signal read from the unit pixels 3 of the selection pixel row of the imaging unit 2 into digital pixel data. The column processing unit 15, particularly, the column AD conversion unit 16, will be described later in detail.

The ramp unit 19 is configured by, for example, an integration circuit. Under the control of the control unit 20, the ramp unit 19 generates a so-called ramp wave of which a level is varied in an inclination shape over time and supplies the ramp wave to one input terminal of the comparison unit 108 via the reference signal line. The ramp unit 19 is not limited to the integration circuit, but may be configured by a DAC circuit. However, when the ramp wave is generated digitally by the use of the DAC circuit, it is necessary to set the step of the ramp wave in detail or to have the equivalent configuration.

The horizontal selection unit 14 is configured by a shift resistor, a decoder, or the like and controls the column address or column scanning of the column AD conversion unit 16 of the column processing unit 15. Under the control of the horizontal selection unit 14, the AD-converted digital data by the column AD conversion unit 16 is sequentially read to the horizontal signal line and transmitted to the output unit 17.

The phase shift unit 18 is configured by a delay circuit or the like in which a plurality of delay units (inversion elements) delaying a pulse signal are connected to each other. The delay units of the phase shift unit 18 are connected to each other in eight stages, and thus the phase shift unit 18 outputs eight-phase clocks CK0, CK1, CK2, CK3, CK4, CK5, CK6, and CK7. The signals output by the delay units form a low-order phase signal to be described below. Further, the delay circuit forming the phase shift unit 18 may be a ring delay circuit in which a plurality of inversion elements are connected to each other in a ring form. In this case, the ring delay circuit itself includes an odd number of delay units, as in a symmetric oscillation circuit. However, an asymmetric oscillation circuit may be used in which the outputs are equivalently even (particularly, a power of two). Further, the ring delay circuit itself may be configured as an RDL (Ring Delay Line) circuit including an even number (particularly, a power of two) of delay units. Alternatively, the ring delay circuit itself may be configured as a so-called fully differential oscillation circuit including an even number (particularly, a power of two) of delay units and the outputs of the final stage of the fully differential inversion circuit including the delay units are returned to the reverse side of the inputs of the initial stage.

The output unit 17 outputs the binarized digital data. Further, the output unit 17 may have signal processing functions such as black level adjustment, column variation correction, and color processing as well as a buffering function. Furthermore, the output unit 17 may convert n-bit parallel digital data into serial data and output the serial data.

The control unit 20 includes a functional block of a TG (Timing Generator) and a functional block for communicating with the TG. The functional block of the TG supplies a clock necessary for the process of each unit such as the ramp unit 19, the phase shift unit 18, the vertical selection unit 12, the horizontal selection unit 14, and the output unit 17 or a pulse signal of a predetermined timing.

Next, the configuration of the column AD conversion unit 16 will be described. Each column AD conversion unit 16 generates a pulse signal having a magnitude (pulse width) corresponding to the magnitude of a reset level (criterion level) or a signal level in a time axis direction by comparing the analog pixel signal read from each unit pixel 3 of the imaging unit 2 via the vertical signal line 13 to the ramp wave supplied from the ramp unit 19 and used for the AD conversion. Then, the column AD conversion unit 16 performs the AD conversion by converting the data corresponding to a period of the pulse width of the pulse signal into digital data corresponding to the magnitude of the pixel signal.

Figure 13:
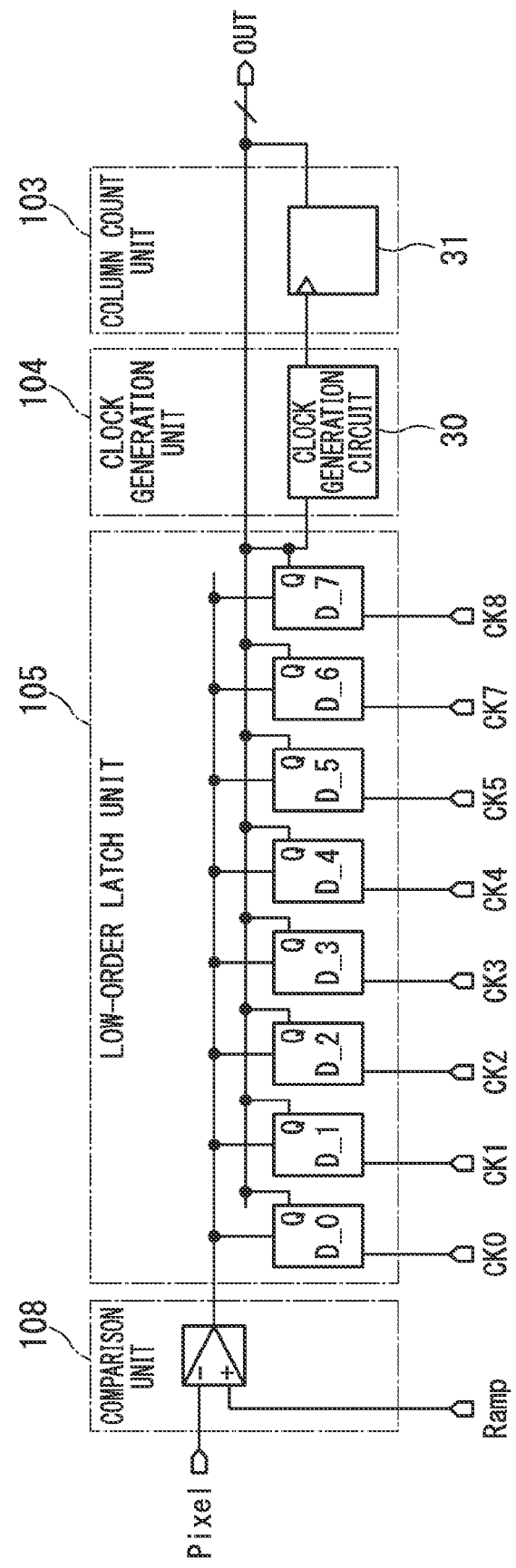
FIG. 13 is a circuit diagram illustrating the configuration of a column processing unit of the imaging device according to the second embodiment of the invention.

Hereinafter, the configuration of the column AD conversion unit 16 will be described in detail. The column AD conversion unit 16 is installed in each column. In FIG. 12, six column AD conversion units 16 are installed. The column AD conversion units 16 in the columns have the same configuration. The column AD conversion unit 16 includes the comparison unit (comparison circuit) 108, a low-order latch unit 105, a clock generation unit 104, and a column count unit 103. FIG. 13 is a diagram illustrating the detailed configuration of the column AD conversion unit 16.

The comparison unit 108 converts the magnitude of the pixel signal Pixel into information (the pulse width of the pulse signal) in the time axis direction by comparing the signal voltage corresponding to the analog pixel signal Pixel output from the unit pixel 3 of the imaging unit 2 via the vertical signal line 13 to the ramp wave Ramp supplied from the ramp unit 19. For example, the comparison output of the comparison unit 108 becomes a high level (H level) when the ramp voltage is greater than the signal voltage. The comparison output becomes a low level (L level) when the ramp voltage is equal to or less than the signal voltage.

The low-order latch unit 105 receives the comparison output of the comparison unit 108 and latches (retains and stores) the logic state (low-order phase signal) of the multi-phase clocks (CK0 to CK7) having a constant phase difference output from the phase shift unit 18 at a timing at which the comparison output is inverted. More specifically, the low-order latch unit 105 includes latch circuits D_0 to D_7 that latch the logic state (low-order phase signal) at predetermined timings of the clocks CK0 to CK7, which are the outputs of the phase shift unit 18, by the comparison output from the comparison unit 108. The clock CK7 input to the latch circuit D_7 of the low-order latch unit 105 is output as a count clock to be counted by the column count unit 103.

The latch circuits D_0 to D_7 are configured by logic circuits such as NAND circuits or inverter circuits having a given circuit threshold value. The clock generation unit 104 includes the clock generation circuit 30 shown in FIG. 1A. The column count unit 103 includes a counter circuit 31 that counts, as a count clock, the clock CK7 output from the phase shift unit 18 and input via the low-order latch unit 105 and the clock generation unit 104.

Next, a process of this example will be described. Here, the specific process of the unit pixel 3 will not be described. However, as known, the unit pixel 3 outputs a reset level and a signal level.

The AD conversion is performed as follows. That is, for example, the ramp wave falling at a predetermined inclination is compared to the voltage of the reset level or the signal level, which is a pixel signal from the unit pixel 3. A period from the generation time of the ramp wave used for the comparison process to a time at which a signal corresponding to the reset level or the signal level matches the ramp wave (ramp voltage) is counted by the clock CK7 output from phase shift unit 18. The digital data corresponding to the magnitude of the reset level or the signal level is obtained by measuring the logic state (low-order phase signal) of the multi-phase clocks (CK0 to CK7) having a constant phase difference.

Here, the reset level containing a noise of the pixel signal is read as an analog pixel signal from each unit pixel 3 of a selected row in the imaging unit 2 in a first reading process. Thereafter, the signal level is read in a second reading process. Then, the reset level and the signal level are chronologically input to the column AD conversion unit 16 via the vertical signal line 13. Further, the signal level may be read in the first reading process and the reset level may be read in the second reading process.

<First Reading Process>

After the first reading process from the unit pixel 3 of any pixel row to the vertical signal line 13 is stabilized, the control unit 20 supplies control data for generating the ramp wave to the ramp unit 19. The ramp unit 19 receiving the control data outputs the ramp wave of which a waveform varies temporally in a ramp shape as a whole, as a comparison voltage given to a first input terminal of the comparison unit 108. The comparison unit 108 compares the voltage of a second input terminal, to which the ramp wave from the ramp unit 19 is given, to the voltage of the first input terminal to which the reset level is given. When both voltages are substantially identical, the comparison unit 108 inverts the comparison output.

The column count unit 103 starts a count process based on the comparison start of the comparison unit 108. The low-order latch unit 105 retains, as a first low-order data signal, the low-order phase signal at the conversion time of the comparison output from the comparison unit 108. The column count unit 103 stops the count process by retaining the low-order phase signal by the low-order latch unit 105 and retains the count result as a first high-order data signal. When a predetermined period passes, the control unit 20 stops supplying the control data to the ramp unit 19 and stops outputting the clock from the phase shift unit 18. Thus, the ramp unit 19 stops generating the ramp wave.

<Second Reading Process>

Next, at the second reading time, a signal level corresponding to the amount of light incident on each unit pixel 3 is read.

After the second reading process from the unit pixel 3 of any pixel row to the vertical signal line 13 is stabilized, the control unit 20 supplies control data for generating the ramp wave to the ramp unit 19. The ramp unit 19 receiving the control data outputs the ramp wave. The comparison unit 108 compares the voltage of a second input terminal, to which the ramp wave from the ramp unit 19 is given, to the voltage of the first input terminal to which the reset level is given. When both voltages are substantially identical, the comparison unit 108 inverts the comparison output.

The column count unit 103 starts the count process based on the comparison start of the comparison unit 108. The low-order latch unit 105 retains, as a second low-order data signal, the low-order phase signal at the conversion time of the comparison output from the comparison unit 108. The column count unit 103 stops the count process by retaining the low-order phase signal by the low-order latch unit 105 and retains the count result as a second high-order data signal. When a predetermined period passes, the control unit 20 stops supplying the control data to the ramp unit 19 and stops outputting the clock from the phase shift unit 18. Thus, the ramp unit 19 stops generating the ramp wave.

<Calculating Process>

The horizontal selection unit 14 outputs the digital data formed by the first and second low-order data signals retained by the low-order latch unit 105 and the first and second high-order data signals retained by the column count unit 103 via the horizontal signal line to transmit the digital data to the output unit 17. Thereafter, the output unit 17 can obtain the digital data with a signal component which is a difference between the reset level and the signal level by performing binarization and subtraction (CDS process). Further, calculation such as the binarization and the subtraction (CDS process) may be performed by the column processing unit 15.

As described above, by disposing the clock generation circuit 30 between the low-order latch unit 105 and the column count unit 103 of the column AD conversion unit 16, the same function as the Schmitt trigger circuit may be realized, thereby reducing the through-current compared to the Schmitt trigger circuit. Accordingly, the imaging device suppressing erroneous count may be realized.

Third Embodiment

Next, a third embodiment of the invention will be described. In the above-described embodiments, the clock generation circuit having the same functions as the Schmitt trigger circuit which outputs the output voltage $V_{OUT}$ with the same phase as the input voltage $V_{IN}$ and the imaging device using the clock generation circuit have been described. However, a clock generation circuit (hereinafter referred to as an inversion clock generation circuit) having the same functions as a Schmitt trigger inverter circuit which outputs an output voltage $V_{OUT}$ with an inverse phase (reverse phase) of the phase of an input voltage $V_{IN}$ may be used in an imaging device. As in the Schmitt trigger circuit according to the related art, there is a probability that erroneous count may occur when the Schmitt trigger inverter circuit outputs a false clock due to a current flowing in the Schmitt trigger inverter circuit and a counter circuit unnecessarily counts a clock. Accordingly, in this embodiment, an inversion clock generation circuit that has the same functions as the Schmitt trigger inverter circuit and is capable of reducing a through-current compared to the Schmitt trigger inverter circuit will be described.

Figure 14A:
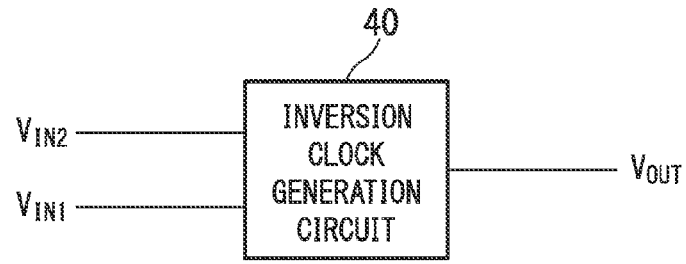
FIG. 14A is a diagram illustrating the configuration of an inversion clock generation circuit according to a third embodiment of the invention.
Figure 14B:
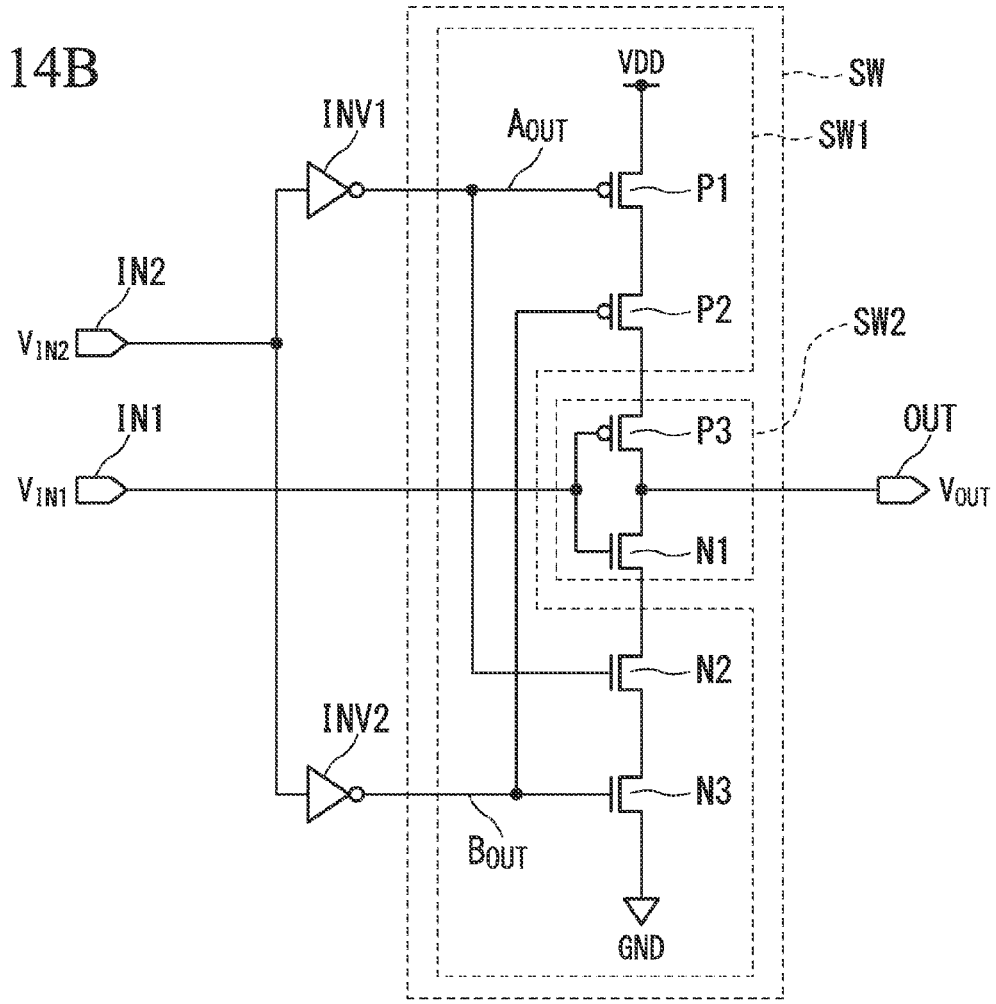
FIG. 14B is a diagram illustrating the configuration of the inversion clock generation circuit according to the third embodiment of the invention.

FIGS. 14A and 14B are diagrams illustrating the configuration of the inversion clock generation circuit according to this embodiment. Hereinafter, the configuration of the inversion clock generation circuit according to this embodiment will be described. An inversion clock generation circuit 40 shown in FIG. 14A outputs a clock (output clock) as an output voltage $V_{OUT}$ inverted from an input voltage $V_{IN1}$ in accordance with two clocks which are input as an input voltage $V_{IN1}$ (second input clock) and an input voltage $V_{IN2}$ (first input clock) from two front-stage circuits (for example, inverter circuits) outputting a voltage having a logic state in accordance with a circuit threshold value.

FIG. 14B shows an example of the detailed configuration of the inversion clock generation circuit 40. As shown in FIG. 14B, the inversion clock generation circuit 40 includes input terminals IN1 and IN2, an output terminal OUT, inverter circuits INV1 and INV2, and a switch circuit SW. The switch circuit SW includes transistors P1, P2, and P3, which are PMOS transistors, and transistors N1, N2, and N3, which are NMOS transistors.

One end of the inverter circuit INV1 (first logic circuit) is connected to the input terminal IN2 and the other end of the inverter circuit INV1 is connected to the gates (first and third control terminals) of the transistors P1 and N2. The inverter circuit INV1 has a first circuit threshold value lower than the circuit threshold value of the front-stage circuit and outputs a signal (first output signal) corresponding to a comparison result obtained by comparing the logic state of a clock input to the input terminal IN to the first circuit threshold value. One end of the inverter circuit INV2 (second logic circuit) is connected to the input terminal IN2 and the other end of the inverter circuit INV2 is connected to the gates (second and fourth control terminals) of the transistors P2 and N3. The inverter circuit INV2 has a second circuit threshold value higher than the circuit threshold value of the front-stage circuit and outputs a signal (second output signal) corresponding to a comparison result obtained by comparing the logic state of the clock input to the input terminal IN to the second circuit threshold value. The input terminal IN1 is connected to the gates (the fifth control terminal and the sixth control terminal) of the transistors P3 and N1.

The switch circuit SW includes switch circuits SW1 and SW2. The switch circuit SW is configured to output signals (output voltages $V_{OUT}$) in accordance with the logic states of three signals, that is, two signals (output voltages $A_{OUT}$ and $B_{OUT}$) output respectively from the inverter circuits INV1 and INV2 and a signal (input voltage $V_{IN1}$) input from the input terminal IN1. More specifically, the switch circuit SW outputs a clock in an H state (first voltage) or an L state (second voltage) as an output voltage $V_{OUT}$, when different states (H and L states or L and H states) of the output voltages $A_{OUT}$ and $B_{OUT}$ are changed to the same states (all H states or all L states) of the output voltages $A_{OUT}$ and $B_{OUT}$ and the input voltage $V_{IN1}$. The logic state of the output voltage $V_{OUT}$ to be output is reverse to the logic state of the input voltage $V_{IN1}$. The circuit threshold value of the switch circuit SW2 is greater than a first circuit threshold value which is the circuit threshold value of the inverter circuit INV1 and is less than a second circuit threshold value which is the circuit threshold value of the inverter circuit INV2.

The transistors P1, P2, N2, and N3 of the switch circuit SW1 and the transistors P3 and N1 of the switch circuit SW2 are connected to each other as follows. A source terminal (first terminal) of the transistor P1 (first transistor) is connected to a power-supply voltage VDD (third voltage). A source terminal (third terminal) of the transistor P2 (second transistor) is connected to a drain terminal (second terminal) of the transistor P1. A source terminal (ninth terminal) of the transistor P3 (fifth transistor) is connected to a drain terminal (fourth terminal) of the transistor P2, and a drain terminal (eleventh terminal) of the transistor P3 is connected to an output terminal OUT.

The drain terminal (eleventh terminal) of the transistor N1 (sixth transistor) is connected to the output terminal OUT. A drain terminal (fifth terminal) of the transistor N2 (third transistor) is connected to a source terminal (twelfth terminal) of the transistor N1. A drain terminal (seventh terminal) of the transistor N3 (fourth transistor) is connected to a source terminal (sixth terminal) of the transistor N2, and a source terminal (eighth terminal) of the transistor N3 is connected to a ground GND (fourth voltage).

Since the input and output characteristics of the inverter circuits INV1 and INV2 are same as the input and output characteristics (see FIG. 2) of the inverter circuit INV1 and INV2 described in the first embodiment, the description thereof will not be repeated.

Figure 15:
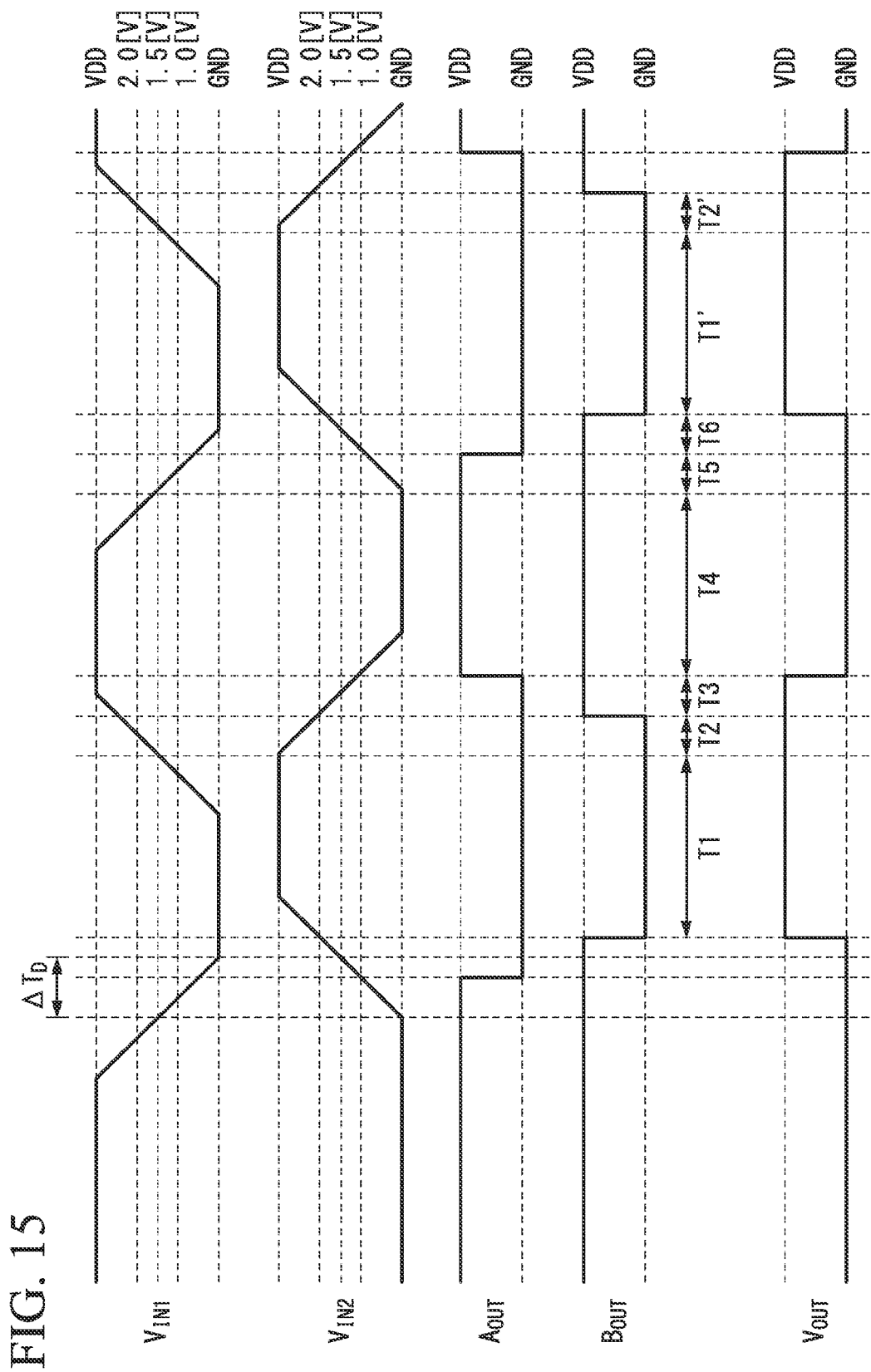
FIG. 15 is a timing chart illustrating a process of an inversion clock generation circuit according to the third embodiment of the invention.

Next, a process of the inversion clock generation circuit 40 will be described. FIG. 15 shows the waveforms of the input voltages $V_{IN1}$ and $V_{IN2}$ input to the input terminal IN1 and IN2 of the inversion clock generation circuit 40, an output voltage $A_{OUT}$ of the inverter circuit INV1, an output voltage $B_{OUT}$ of the inverter circuit INV2, and the output voltage $V_{OUT}$ output from the output terminal OUT of the inversion clock generation circuit 40.

Hereinafter, the description will be made on the assumption that the circuit threshold value of the inverter circuit INV1 is set to 1.0 [V], the circuit threshold value of the inverter circuit INV2 is set to 2.0 [V], and the circuit threshold values of the switch circuit SW2 (the transistors P3 and N1), the front-stage circuit, and the rear-stage circuit are set to 1.5 [V]. Further, the description will be made on the assumption that the input voltage $V_{IN2}$ is a voltage of which a phase is reverse to the phase of the input voltage $V_{IN1}$ (a phase difference is in the range from 180 degrees to 360 degrees) and is delayed by a delay time $\Delta T_D$ from the input voltage $V_{IN1}$. Since the phases of the input voltages $V_{IN1}$ and $V_{IN2}$ are reverse to one another, the logic states of the input voltages $V_{IN1}$ and $V_{IN2}$ are reverse to one another at a given time.

FIG. 16 is a diagram illustrating the logical values of the input voltage $V_{IN1}$, the input voltage $V_{IN2}$, the output voltage $A_{OUT}$, the output voltage $B_{OUT}$, and the output voltage $V_{OUT}$. Further, in FIG. 16, "0" corresponds to an L state and "1" corresponds to an H state.

Since the input voltage $V_{IN2}$ is higher than the circuit threshold value of the inverter circuit INV1 and the circuit threshold value of the inverter circuit INV2 during a period T1 of FIG. 15, the inverter circuits INV1 and INV2 determine that the logic state of the input voltage $V_{IN2}$ is the H state (logic value "1"). Therefore, the output voltages $A_{OUT}$ and $B_{OUT}$ become the L state (logic value "0"). Further, the input voltage $V_{IN1}$ is lower than the circuit threshold values of the transistors P3 and N1. In this state, since the transistors P1, P2, and P3 are turned on and the transistors N1, N2, and N3 are turned off, the output voltage $V_{OUT}$ becomes the H state (logic state "1").

Since the input voltage $V_{IN2}$ is higher than the circuit threshold value of the inverter circuit INV1 and the circuit threshold value of the inverter circuit INV2 during a period T2 of FIG. 15, the inverter circuits INV1 and INV2 determine that the logic state of the input voltage $V_{IN2}$ is the H state (logic value "1"). Therefore, the output voltages $A_{OUT}$ and $B_{OUT}$ become the L state (logic value "0"). Further, the input voltage $V_{IN1}$ is higher than the circuit threshold values of the transistors P3 and N1. In this state, since the transistors P1, P2, and N1 are turned on and the transistors P3, N2, and N3 are turned off, the output voltage $V_{OUT}$ becomes the H state (logic state "1").

Since the input voltage $V_{IN2}$ is higher than the circuit threshold value of the inverter circuit INV1 and is lower than the circuit threshold value of the inverter circuit INV2 during a period T3 of FIG. 15, the inverter circuit INV1 determines that the logic state of the input voltage $V_{IN2}$ is the H state (logic value "0") and the inverter circuit INV2 determines that the logic state of the input voltage $V_{IN2}$ is the L state (logic value "1"). Therefore, the output voltage $A_{OUT}$ becomes the L state (logic value "0") and the output voltage $B_{OUT}$ becomes the H state (logic value "1"). The input voltage $V_{IN1}$ becomes higher than the circuit threshold values of the transistors P3 and N1. In this state, since the transistors P1, N1, and N3 are turned on and the transistors P2, P3, and N2 are turned off, the output voltage $V_{OUT}$ retains the H state (logic value "1") which is the previous state.

Since the input voltage $V_{IN2}$ is lower than the circuit threshold values of the inverter circuits INV1 and INV2 during a period T4 of FIG. 15, the inverter circuits INV1 and INV2 determine that the logic state of the input voltage $V_{IN2}$ is the L state (logic value "0"). Therefore, the output voltages $A_{OUT}$ and $B_{OUT}$ become the H state (logic value "1"). The input voltage $V_{IN1}$ becomes higher than the circuit threshold values of the transistors P3 and N1. In this state, since the transistors P1, P2, and P3 are turned off and the transistors N1, N2, and N3 are turned on, the output voltage $V_{OUT}$ becomes the L state (logic value "0").

Since the input voltage $V_{IN2}$ is lower than the circuit threshold values of the inverter circuits INV1 and INV2 during a period T5 of FIG. 15, the inverter circuits INV1 and INV2 determine that the logic state of the input voltage $V_{IN2}$ is the L state (logic value "0"). Therefore, the output voltages $A_{OUT}$ and $B_{OUT}$ become the H state (logic value "1"). The input voltage $V_{IN1}$ becomes lower than the circuit threshold values of the transistors P3 and N1. In this state, since the transistors P3, N2, and N3 are turned on and the transistors P1, P2, and N1 are turned off, the output voltage $V_{OUT}$ retains the L state (logic value "0").

Since the input voltage $V_{IN2}$ is higher than the circuit threshold value of the inverter circuit INV1 and is lower than the circuit threshold value of the inverter circuit INV2 during a period T6 of FIG. 15, the inverter circuit INV1 determines that the logic state of the input voltage $V_{IN2}$ is the H state (logic value "1") and the inverter circuit INV2 determines that the logic state of the input voltage $V_{IN2}$ is the L state (logic value "1"). Therefore, the output voltage $A_{OUT}$ becomes the L state (logic value "0") and the output voltage $B_{OUT}$ become the H state (logic value "1"). The input voltage $V_{IN1}$ becomes lower than the circuit threshold values of the transistors P3 and N1. In this state, since the transistors P1, P2, and N3 are turned on and the transistors P2, N1, and N2 are turned off, the output voltage $V_{OUT}$ retains the L state (logic value "0") which is the previous state.

The circuit state during a period T1' of FIG. 15 is the same as the circuit state during the period T1. In this state, since the transistors P1, P2, and P3 are turned on and the transistors N1, N2, N3 are turned off, the output voltage $V_{OUT}$ becomes the H state (logic value "1"). A process during a period subsequent to the period T1' is the same as the process during the period T2. The same processes are repeated in accordance with the change in the input voltages $V_{IN1}$ and $V_{IN2}$ using the above-described processes during the periods T1 to T6 as a unit.

As shown in FIG. 16, the output voltage $V_{OUT}$ is changed only when the different states of the output voltage $A_{OUT}$ of the inverter circuit INV1 and the output voltage $B_{OUT}$ of the inverter circuit INV2 are changed from the same state of the output voltage $A_{OUT}$ of the inverter circuit INV1 and the output voltage $B_{OUT}$ of the inverter circuit INV2. In FIG. 16, the output voltage $V_{OUT}$ is changed between the periods T3 and T4 and between the periods T6 and T1'. During a period immediately before the change in the output voltage $V_{OUT}$, the logic state of the output voltage $A_{OUT}$ of the inverter circuit INV1 is different from that of the output voltage $B_{OUT}$ of the inverter circuit INV2. During a period immediately after the change in the output voltage $V_{OUT}$, the logic state of the output voltage $A_{OUT}$ of the inverter circuit INV1 is the same as that of the output voltage $B_{OUT}$ of the inverter circuit INV2.

Even when a Meta-Stable state occurs in the front-stage circuit, the output voltage $V_{OUT}$ is not changed under the conditions except for the case in which all of the transistors P3 and N1 and the inverter circuits INV1 and INV2 determine that the logic states of the input voltages $V_{IN1}$ and $V_{IN2}$ are the H state or the L state. This means that no false clock is generated even when the Meta-Stable state occurs in the front-stage circuit, as in the first embodiment.

Figures 17, 18:
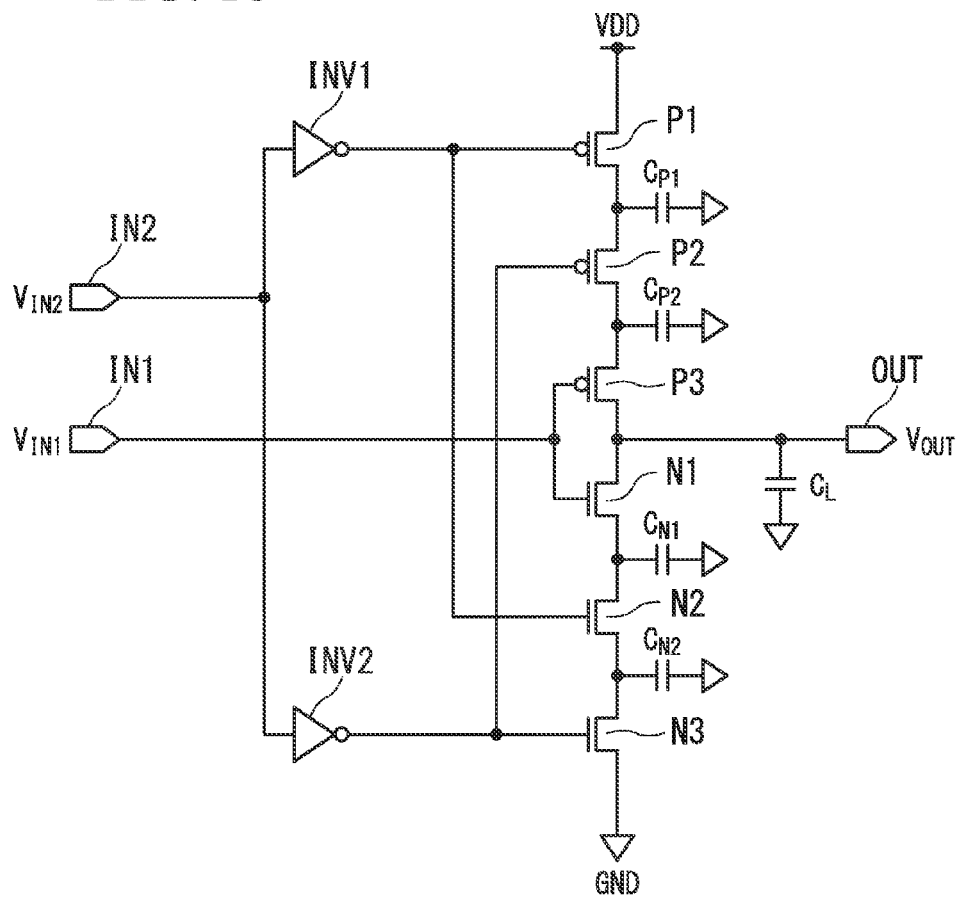
FIG. 17 is a reference diagram illustrating the states of resistors of a switch according to the third embodiment of the invention.
FIG. 18 is a circuit diagram illustrating the inversion clock generation circuit according to the third embodiment of the invention.
Figure 19A:
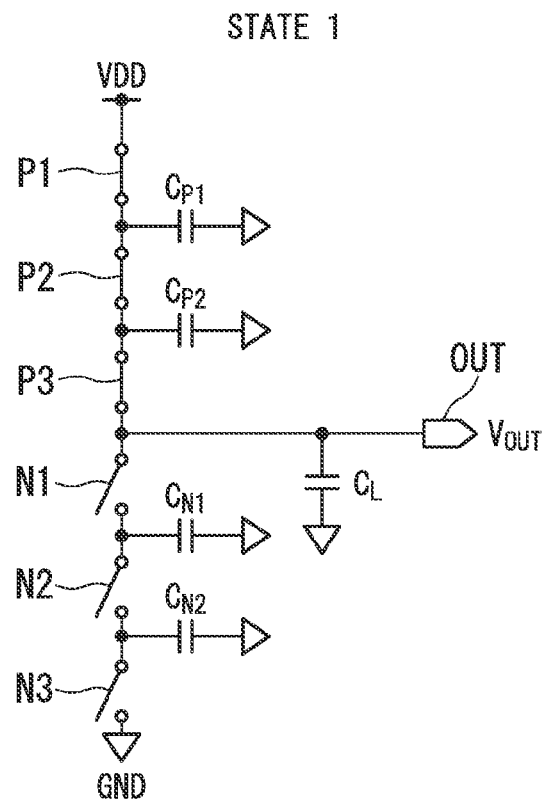
FIG. 19A is a circuit diagram illustrating the inversion clock generation circuit according to the third embodiment of the invention.
Figure 19B:
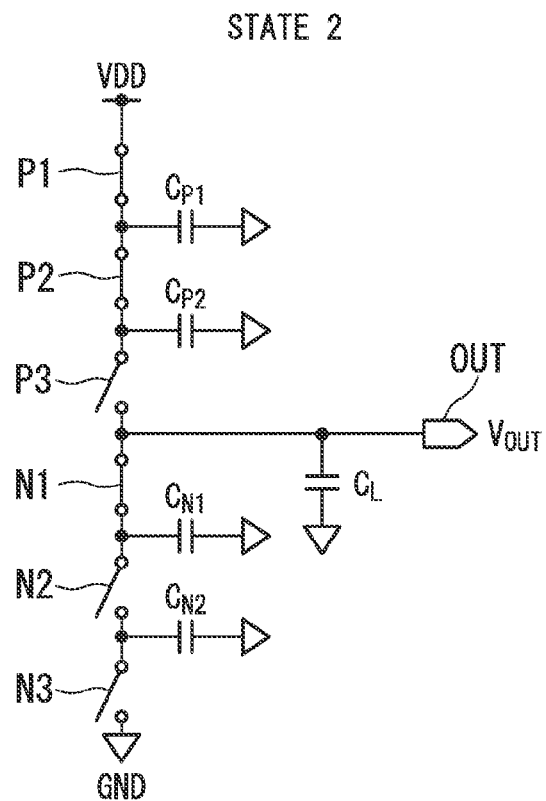
FIG. 19B is a circuit diagram illustrating the inversion clock generation circuit according to the third embodiment of the invention.
Figure 20A:
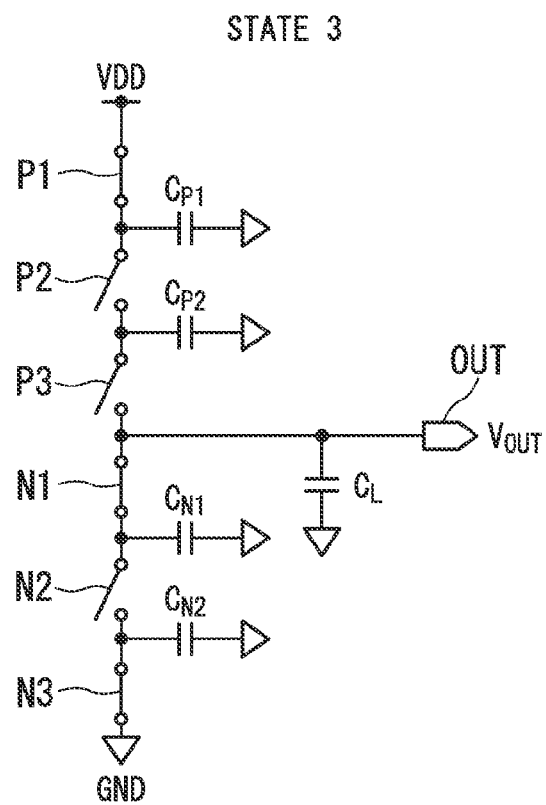
FIG. 20A is a circuit diagram illustrating the inversion clock generation circuit according to the third embodiment of the invention.
Figure 20B:
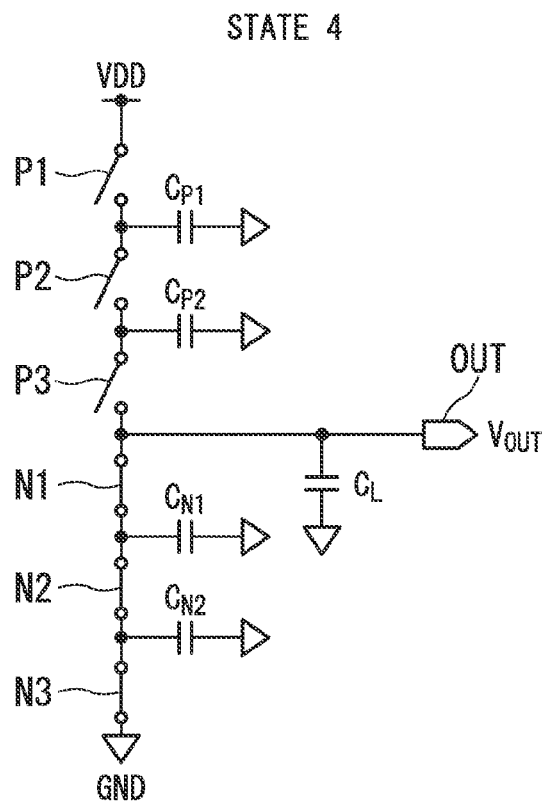
FIG. 20B is a circuit diagram illustrating the inversion clock generation circuit according to the third embodiment of the invention.
Figure 21A:
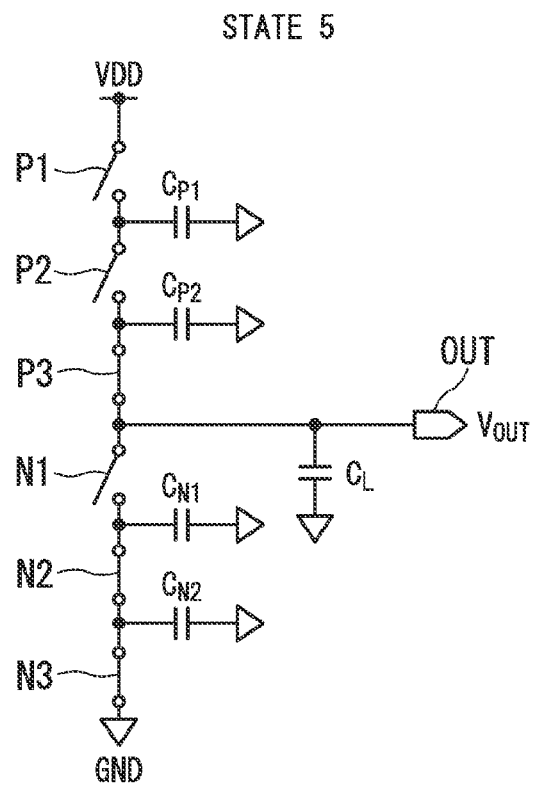
FIG. 21A is a circuit diagram illustrating the inversion clock generation circuit according to the third embodiment of the invention.
Figure 21B:
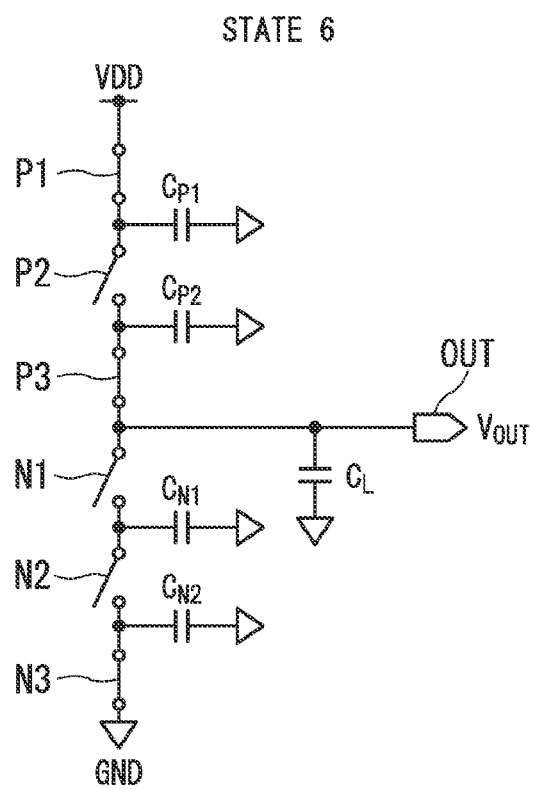
FIG. 21B is a circuit diagram illustrating the inversion clock generation circuit according to the third embodiment of the invention.
Figure 22:
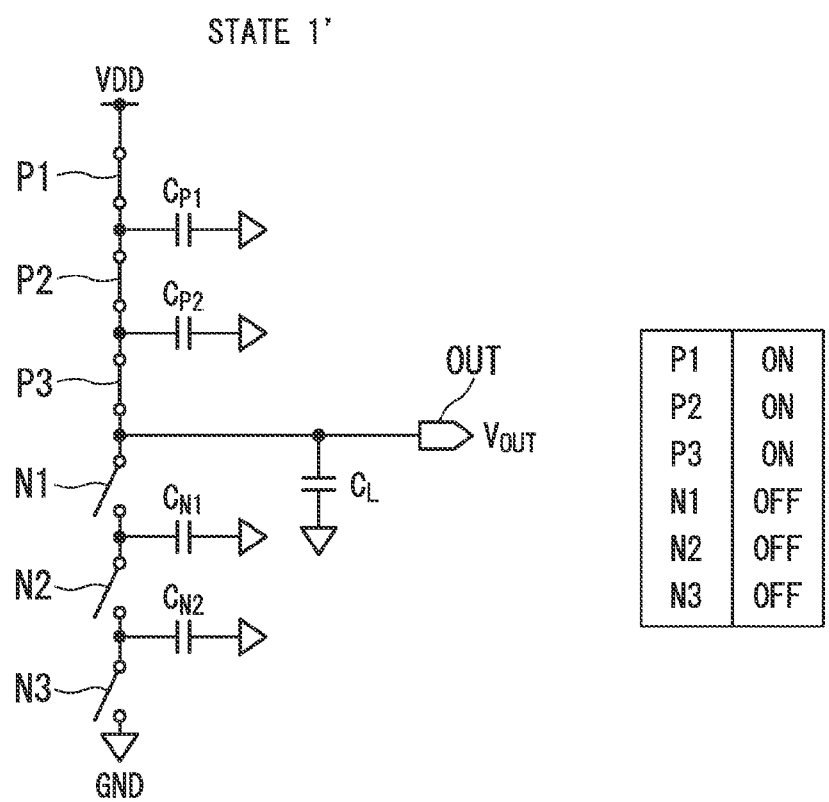
FIG. 22 is a circuit diagram illustrating the inversion clock generation circuit according to the third embodiment of the invention.

FIG. 17 shows the states of the transistors P1, P2, P3, N1, N2, and N3 during the periods T1 to T1' of FIG. 15. In FIG. 17, states 1 to 1' correspond to the periods T1 to T1' of FIG. 15, respectively.

As shown in FIG. 17, when the state of each transistor is changed from state 1 to state 2, the transistors N2 and N3 remain the OFF state. When the state of each transistor is changed from state 2 to state 3, the transistors P3 and N2 remain the OFF state. When the state of each transistor is changed from state 3 to state 4, the transistors P2 and P3 remain the OFF state. When the state of each transistor is changed from state 4 to state 5, the transistors P1 and P2 remain the OFF state. When the state of each transistor is changed from state 5 to state 6, the transistors P2 and N1 remain the OFF state. When the state of each transistor is changed from state 6 to state 1', the transistors N1 and N2 remain the OFF state. In this way, when the state of each transistor is changed, some of the transistors are necessarily in the OFF state. Accordingly, a pass in which a through-current flows via the six transistors is not formed in the switch circuit SW according to this embodiment.

According to this embodiment, as described above, the clock generation circuit realizes the same function as the Schmitt trigger inverter circuit and may reduce the through-current compared to the Schmitt trigger inverter circuit. Thus, the generation of the false clock may be reduced. Further, since the front-stage logic circuit of the switch circuit SW is configured by the inverter circuit, the clock generation circuit may be easily configured.

In this embodiment, the case in which the input voltage $V_{IN2}$ is delayed by the delay time $\Delta T_D$ than the input voltage $V_{IN1}$ has been described, but the delay time $\Delta T_D$ may be equal to 0. When the phase of the input voltage $V_{IN2}$ inverted from the input voltage $V_{IN1}$ is not advanced from the phase of the input voltage $V_{IN1}$, the hysteresis characteristic may be formed by adjusting the delay time $\Delta T_D$. Therefore, the hysteresis characteristic may be adjusted in accordance with the range of the delay time $\Delta T_D$. For example, when the delay time $\Delta T_D$ is decreased, the hysteresis width of the inversion clock generation circuit 40 is narrowed. When the delay time $\Delta T_D$ is increased, the hysteresis width of the inversion clock generation circuit 40 is broadened.

In the configuration shown in FIGS. 14A and 14B, an erroneous process of the rear-stage circuit caused due to the change in the output voltage $V_{OUT}$ may be reduced. Hereinafter, the advantage of reducing the erroneous process of the rear-stage circuit caused due to the change in the output voltage $V_{OUT}$ is described.

FIG. 18 is a diagram illustrating the configuration of the inversion clock generation circuit 40 according to this embodiment. FIG. 18 is diagram illustrating a configuration in which parasitic capacitances $C_L$, $C_{P1}$, $C_{P2}$, $C_{N1}$, and $C_{N2}$ causing the change in the output voltage $V_{OUT}$ are provided in addition to the configuration shown in FIGS. 14A and 14B.

FIGS. 19A to 22 are diagrams illustrating the states of the transistors P1, P2, P3, N1, N2, and N3 during the periods T1 to T1' shown in FIG. 15 in the configuration shown in FIG. 18. States 1 to 1' in FIGS. 19A to 22 correspond to the periods T1 to T1' shown in FIG. 15, respectively.

In state 1 (FIG. 19A), the transistors N1, N2, and N3 are turned off and the transistors P1, P2, and P3 are turned on. At this time, the output voltage $V_{OUT}$ is the power-supply voltage VDD. The parasitic capacitances $C_L$, $C_{P1}$, and $C_{P2}$ are charged by the power-supply voltage VDD.

In state 2 (FIG. 19B), the transistors P3, N2, and N3 are turned off and the transistors P1, P2, and N1 are turned on. At this time, since the parasitic capacitances $C_L$ and $C_{N1}$ are connected to one another via the transistor N1, the charge accumulated in the parasitic capacitance $C_L$ is distributed to the parasitic capacitances $C_L$ and $C_{N1}$, thereby causing the change in the output voltage $V_{OUT}$. However, the change in the output voltage $V_{OUT}$ may be suppressed by allowing the parasitic capacitance $C_L$ to be sufficiently greater than the parasitic capacitance $C_{N1}$.

In state 3 (FIG. 20A), the transistors P2, P3, and N2 are turned off and the transistors P1, N1, and N3 are turned on. At this time, since the transistors P3 and N2 connected to the output terminal OUT are turned off, the output voltage $V_{OUT}$ is retained as the power-supply voltage VDD.

In state 4 (FIG. 20B), the transistors P1, P2, and P3 are turned off and the transistors N1, N2, and N3 are turned on. At this time, the output voltage $V_{OUT}$ becomes the ground GND, and thus the parasitic capacitances $C_L$ and $C_{N1}$ are discharged.

In state 5 (FIG. 21A), the transistors P1, P2, and N1 are turned off and the transistors P3, N2, and N3 are turned on. At this time, since the parasitic capacitances $C_L$ and $C_{P2}$ are connected to one another via the transistor P3, the charge accumulated in the parasitic capacitance $C_{P2}$ is distributed to the parasitic capacitances $C_L$ and $C_{P2}$, thereby causing the change in the output voltage $V_{OUT}$. However, the change in the output voltage $V_{OUT}$ may be suppressed by allowing the parasitic capacitance $C_L$ to be sufficiently greater than the parasitic capacitance $C_{P2}$.

In state 6 (FIG. 21B), the transistors P2, N1, and N2 are turned off and the transistors P1, P3, and N3 are turned on. At this time, since the transistors P2 and N1 connected to the output terminal OUT are turned off, the output voltage $V_{OUT}$ is retained as the power-supply voltage VDD.

In state 1' (FIG. 22), the transistors N1, N2, and N3 are turned off and the transistors P1, P2, and P3 are turned on. At this time, the output voltage $V_{OUT}$ becomes the power-supply voltage VDD. Further, the parasitic capacitances $C_L$, $C_{P1}$, and $C_{P2}$ are charged by the power-supply voltage VDD.

In the configuration shown in FIGS. 14A and 14B, as described above, the erroneous process of the rear-stage circuit caused due to the change in the output voltage $V_{OUT}$ may be reduced by allowing the parasitic capacitance $C_L$ to be sufficiently greater than the parasitic capacitances $C_{P2}$ and $C_{N1}$.

Figure 23:
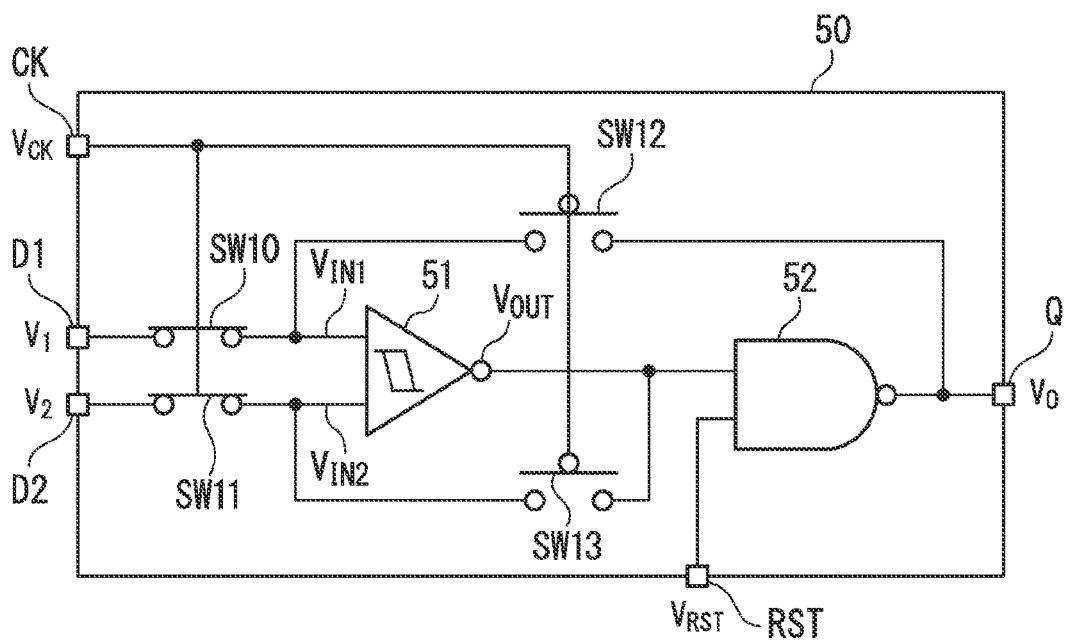
FIG. 23 is a circuit diagram illustrating a latch circuit according to the third embodiment.

Next, a specific example of the reduction in an erroneous process in a circuit using the inversion clock generation circuit according to this embodiment is described. FIG. 23 is a diagram illustrating an example of a latch circuit using the inversion clock generation circuit according to this embodiment. Hereinafter, the configuration of the example is described. The latch circuit 50 shown in FIG. 23 latches (retains) two clocks (input clocks) input as the input voltages $V_{IN1}$ and $V_{IN2}$ from the front-stage circuit in accordance with a timing of an input voltage $V_{CK}$ which is a clock with a predetermined frequency, and then outputs an output voltage $V_O$.

As shown in FIG. 23, the latch circuit 50 includes input terminals D1, D2, CK, and RST, an output terminal Q, an inversion clock generation circuit 51 according to this embodiment, switches SW10, SW11, SW12, and SW13, and an a two-input NAND circuit 52.

One end of the switch SW10 is connected to the input terminal D1 and the other end of the switch SW10 is connected to one input terminal (corresponding to the input terminal IN1 in FIG. 14) of the inversion clock generation circuit 51 and one end of the switch SW12. One end of the switch SW11 is connected to the input terminal D2 and the other end of the switch SW11 is connected to the other input terminal (corresponding to the input terminal IN2 in FIGS. 14A and 14B) of the inversion clock generation circuit 51 and one end of the switch SW13.

One end of the switch SW12 is connected to the one input terminal (corresponding to the input terminal IN1 in FIGS. 14A and 14B) of the inversion clock generation circuit 51 and the other end of the switch SW10, and the other end of the switch SW12 is connected to the output terminal of the NAND circuit 52 and the output terminal Q. One end of the switch SW13 is connected to the other input terminal (corresponding to the input terminal IN2 in FIGS. 14A and 14B) of the inversion clock generation circuit 51 and the other end of the switch SW11, and the other end of the switch SW13 is connected to the output terminal of the inversion clock generation circuit 51 and one input terminal of the NAND circuit 52.

The switches SW10, SW11, SW12, and SW13 are controlled by the input voltage $V_{CK}$ input from the input terminal CK. When the input voltage $V_{CK}$ is in the H state, the switches SW10 and SW11 are each turned on and the switches SW12 and SW13 are each turned off. Further, when the input voltage $V_{CK}$ is in the L state, the switches SW10 and SW11 are each turned off and the switches SW12 and SW13 are each turned on.

The one end input terminal (corresponding to the input terminal IN1 in FIGS. 14A and 14B) of the inversion clock generation circuit 51 is connected to the other end of the switch SW10 and the one end of the switch SW12. The other end input terminal (corresponding to the input terminal IN2 in FIGS. 14A and 14B) of the inversion clock generation circuit 51 is connected to the other end of the switch SW11 and the one end of the switch SW13, and the output terminal of the inversion clock generation circuit 51 is connected to the one input terminal of the NAND circuit 52 and the one end of the switch SW13.

The one input terminal of the NAND circuit 52 is connected to the output terminal of the inversion clock generation circuit 51 and the other end of the switch SW13. The other input terminal of the NAND circuit 52 is connected to the input terminal RST and the output terminal of the NAND circuit 52 is connected to the output terminal Q and the other end of the switch SW12.

FIGS. 24 to 29 are diagrams illustrating input and output characteristics of the latch circuit 50. Hereinafter, the description is made likewise on the assumption that the circuit threshold value of the inverter circuit INV1 of the inversion clock generation circuit 51 is set to 1.0 [V], the circuit threshold value of the inverter circuit INV2 is set to 2.0 [V], and the circuit threshold value of the NAND circuit is set to 1.5 [V].

The latch circuit 50 outputs the output voltage $V_0$ based on the input voltages $V_1$ and $V_2$ at the timing which the input voltage $V_{CK}$ changes from the H state to the L state. There are a plurality of timings at which the latch circuit 50 latches (retains/stores) a signal in accordance with the input voltages $V_1$ and $V_2$. Hereinafter, each of the timings will be described. The input voltage VRST of the input terminal RST is assumed below to be normally in the H state.

When the input voltages "$V_1=V_{IN1}$" are in the L state and the input voltages "$V_2=V_{IN2}$" are in the H state, the output voltages $A_{OUT}$ and $B_{OUT}$ of the inversion clock generation circuit 51 are in the L state. In this state, when the input voltage $V_{CK}$ is changed from the H state to the L state, the transistors P1, P2, and P3 of the inversion clock generation circuit 51 are turned on, the output voltage $V_{OUT}$ becomes the H state, and the output voltage $V_0$ becomes the L state (logic value "0"). At this time, the state of the inversion clock generation circuit 51 corresponds to the period T1 in FIG. 15.

When the input voltages "$V_1=V_{IN1}$" are in the H state and the input voltages "$V_2=V_{IN2}$" are in the H state, the output voltages $A_{OUT}$ and $B_{OUT}$ of the inversion clock generation circuit 51 are in the L state. In this state, when the input voltage $V_{CK}$ is changed from the H state to the L state, the transistors N1, N2 and N3 of the inversion clock generation circuit 51 are turned on, the output voltage $V_{OUT}$ becomes the L state, and the output voltage $V_0$ becomes the H state (logic value "1"). At this time, the state of the inversion clock generation circuit 51 corresponds to the period T4 in FIG. 15.

Figure 24:
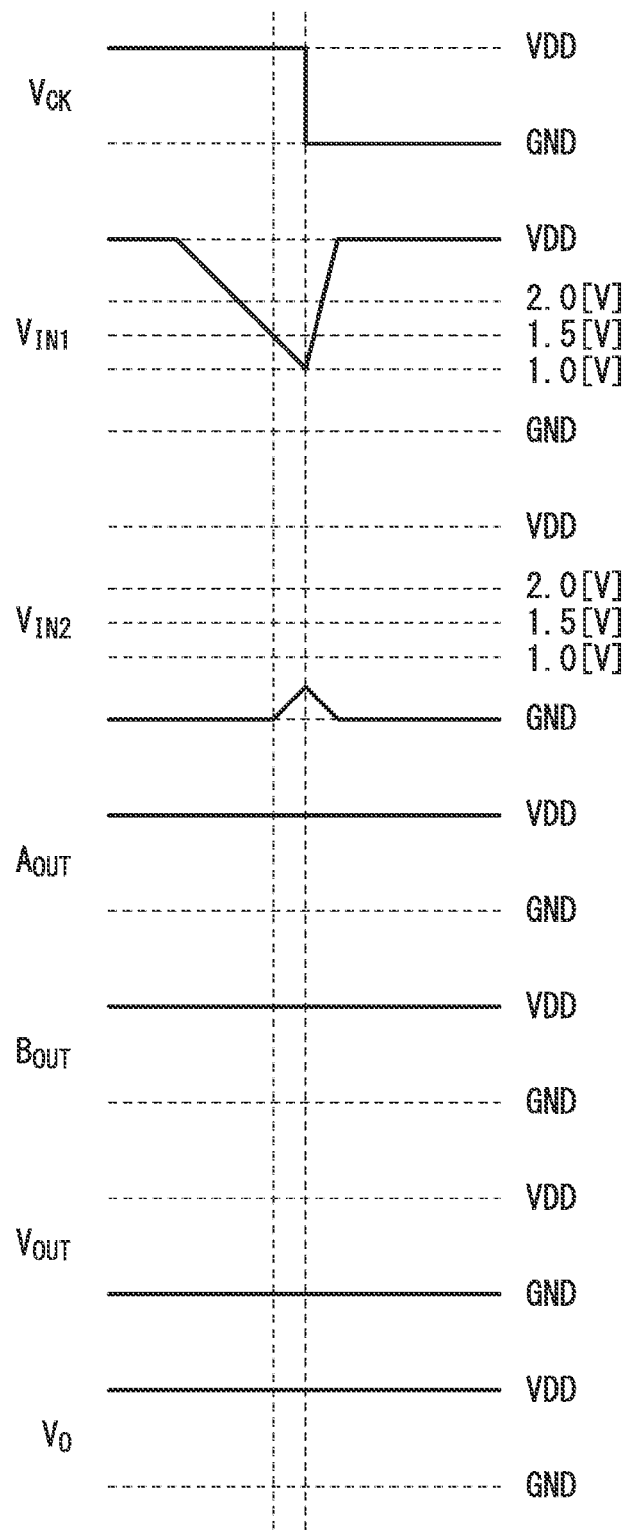
FIG. 24 is a timing chart illustrating a process of the latch circuit according to the third embodiment of the invention.

FIG. 24 shows a case in which the input voltage $V_{CK}$ is changed from the H state to the L state before the input voltages "$V_2=V_{IN2}$" are changed from the L state to the H state (the input voltages "$V_2=V_{IN2}$" are equal to or less than 1.0 [V]) and the input voltages "$V_1=V_{IN1}$" are changed from the H state to the L state. In this case, since the output voltages $A_{OUT}$ and $B_{OUT}$ are in the H state, the transistors P1, P2, and N1 of the inversion clock generation circuit 51 are turned off and the transistors P3, N2, and N3 are turned on, the output voltage $V_{OUT}$ retains the previous state (L state). Accordingly, the output voltage $V_0$ becomes the H state (logic value "1"). At this time, when the switch SW12 is turned on, feedback is thus formed from the output terminal of the NAND circuit 52 to the one input terminal of the inversion clock generation circuit 51 via the switch SW12 and the input voltage $V_{IN1}$ becomes the H state.

Figure 25:
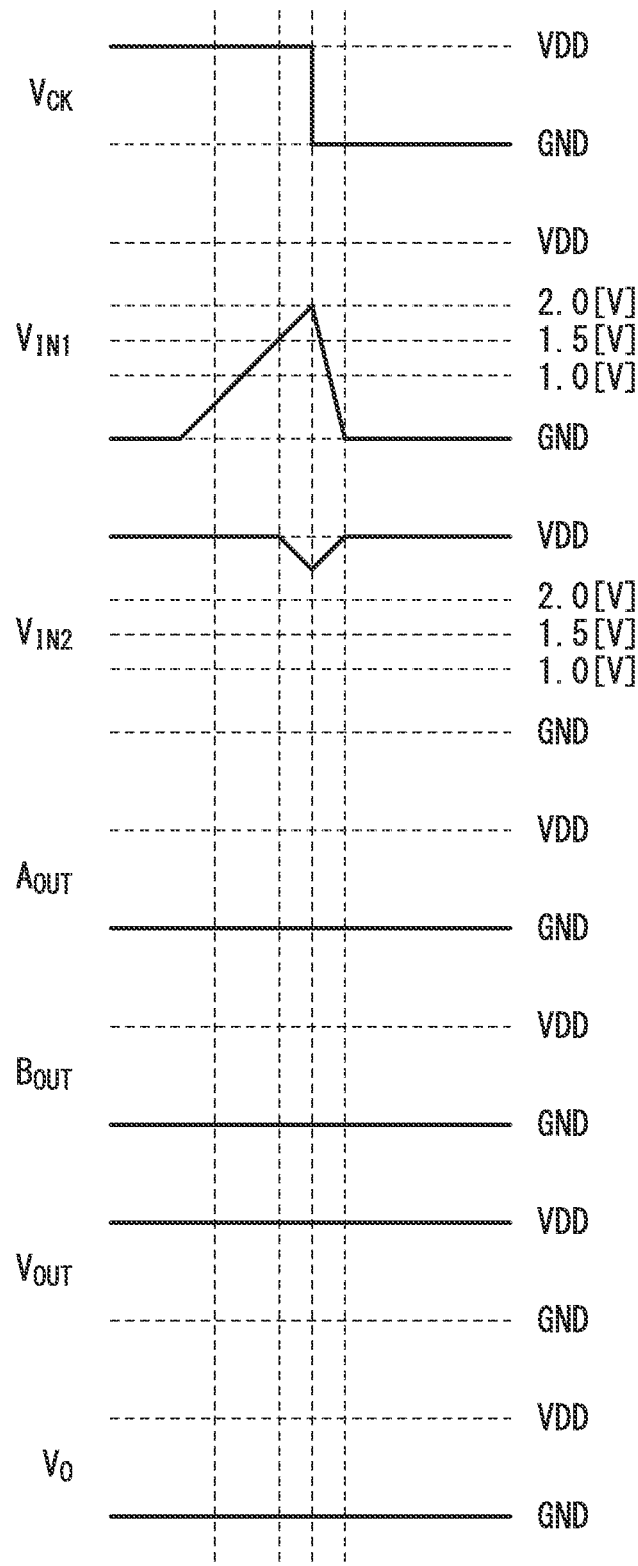
FIG. 25 is a timing chart illustrating a process of the latch circuit according to the third embodiment of the invention.

FIG. 25 shows a case in which the input voltage $V_{CK}$ is changed from the H state to the L state before the input voltages "$V_2=V_{IN2}$" are changed from the H state to the L state (the input voltages "$V_2=V_{IN2}$" are equal to or greater than 2.0 [V]) and the input voltages "$V_1=V_{IN1}$" are changed from the L state to the H state. In this case, since the output voltages $A_{OUT}$ and $B_{OUT}$ are in the L state, the transistors P3, N2, and N3 of the inversion clock generation circuit 51 are turned off and the transistors P1, P2, and N1 are turned on, the output voltage $V_{OUT}$ retains the previous state (H state). Accordingly, the output voltage $V_0$ becomes the L state (logic value "0"). At this time, when the switch SW12 is turned on, feedback is thus formed from the output terminal of the NAND circuit 52 to the one input terminal of the inversion clock generation circuit 51 via the switch SW12 and the input voltage $V_{IN1}$ becomes the L state.

Figure 26:
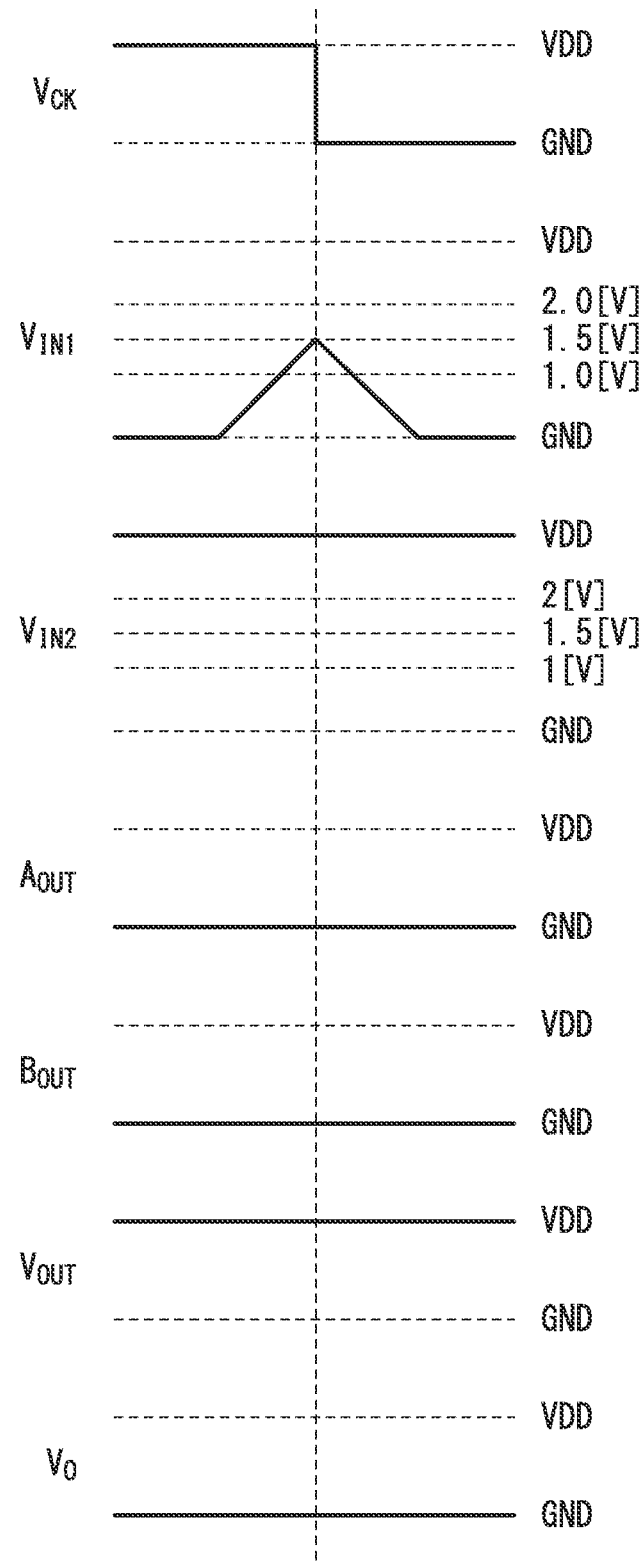
FIG. 26 is a timing chart illustrating a process of the latch circuit according to the third embodiment of the invention.

FIG. 26 shows a case in which the input voltage $V_{CK}$ is changed from the H state to the L state, when the input voltages "$V_1=V_{IN1}$" reach a voltage, the circuit threshold value near 1.5 [V] during the change of the input voltages "$V_1=V_{IN1}$" from the L state to the H state, and the input voltages "$V_2=V_{IN2}$" are in the H state. In this case, since the input voltages "$V_1=V_{IN1}$" are changed to the voltage equal to the circuit threshold value 1.5 [V] from the L state, the transistor P3 of the inversion clock generation circuit 51 is turned off and the transistor N1 is turned on. However, since the input voltages "$V_2=V_{IN2}$" are in the H state, the output voltages $A_{OUT}$ and $B_{OUT}$ are in the L state. Since the transistors N2 and N3 of the inversion clock generation circuit 51 are turned off and the transistors P1 and P2 are turned on, the output voltage $V_{OUT}$ retains the previous state (H state). Accordingly, the output voltage $V_0$ becomes the L state (logic value "0"). At this time, when the switch SW12 is turned on, feedback is thus formed from the output terminal of the NAND circuit 52 to the one input terminal of the inversion clock generation circuit 51 via the switch SW12 and the input voltage $V_{IN1}$ becomes the L state. During that time, the output voltage $V_0$ of the latch circuit 50 remains in the L state. Therefore, even when the latch circuit 50 latches (retains/stores) a signal at the timing at which the input voltages "$V_1=V_{IN1}$" are changed to the voltage near the circuit threshold value, the output voltage $V_O$ is not in an unstable state in which the output voltage $V_O$ is not be stabilized in the H state or the L state.

Figure 27:
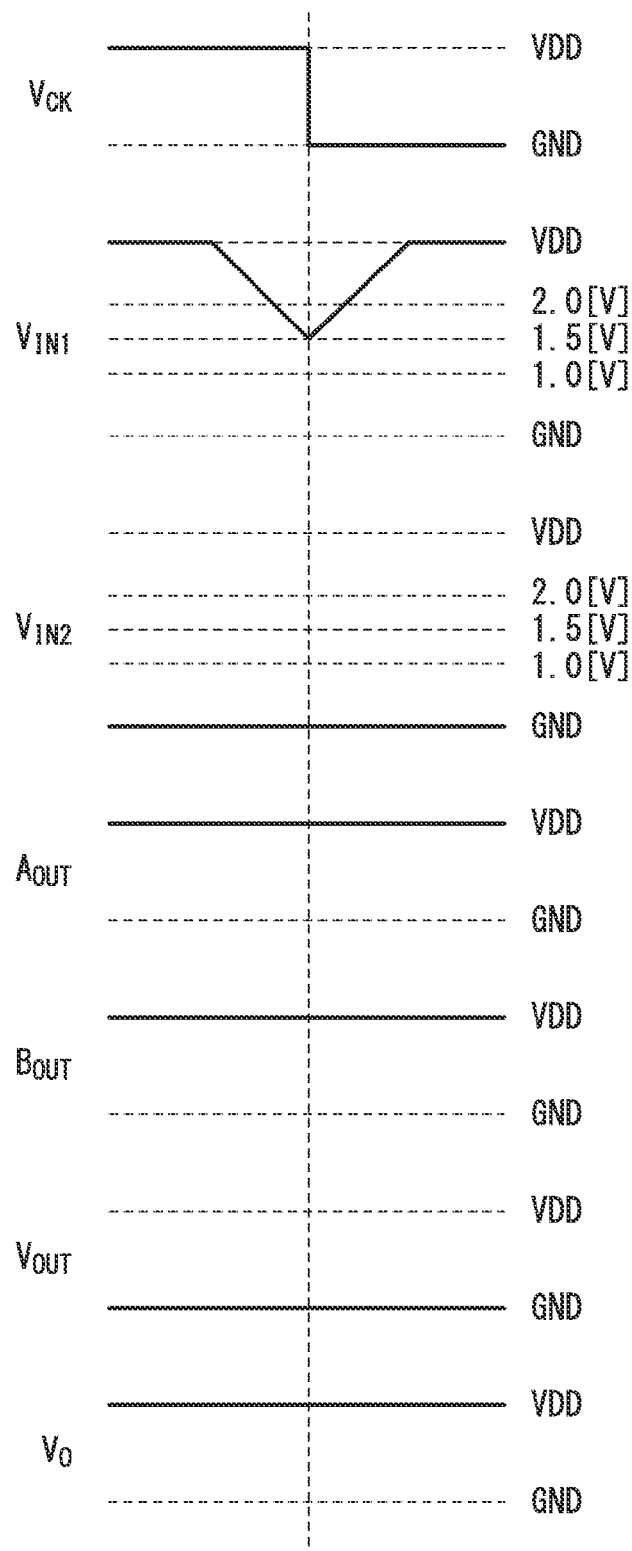
FIG. 27 is a timing chart illustrating a process of the latch circuit according to the third embodiment of the invention.

FIG. 27 shows a case in which the input voltage $V_{CK}$ is changed from the H state to the L state when the input voltages "$V_1=V_{IN1}$" reach a voltage, the circuit threshold value near 1.5 [V] during the change of the input voltages "$V_1=V_{IN1}$" from the L state to the H state, and the input voltages "$V_2=V_{IN2}$" are in the H state. In this case, since the input voltages "$V_1=V_{IN1}$" are changed to the voltage equal to the circuit threshold value 1.5 [V] from the H state, the transistor N1 of the inversion clock generation circuit 51 is turned off and the transistor P3 is turned on. However, since the input voltages "$V_2=V_{IN2}$" are in the L state, the output voltages $A_{OUT}$ and $B_{OUT}$ are in the H state. Since the transistors P1 and P2 of the inversion clock generation circuit 51 are turned off and the transistors N2 and N3 are turned on, the output voltage $V_{OUT}$ retains the previous state (L state). Accordingly, the output voltage $V_O$ becomes the H state (logic value "1"). At this time, when switch SW12 is turned on, feedback is thus formed from the output terminal of the NAND circuit 52 to the one input terminal of the inversion clock generation circuit 51 via the switch SW12 and the input voltage $V_{IN1}$ becomes the L state. During that time, the output voltage $V_O$ of the latch circuit 50 remains the H state. Therefore, even when the latch circuit 50 latches (retains/stores) a signal at the timing at which the input voltages "$V_1=V_{IN1}$" are changed to the voltage near the circuit threshold value, the output voltage $V_O$ is not in an unstable state in which the output voltage $V_O$ is not be stabilized in the H state or the L state.

Figure 28:
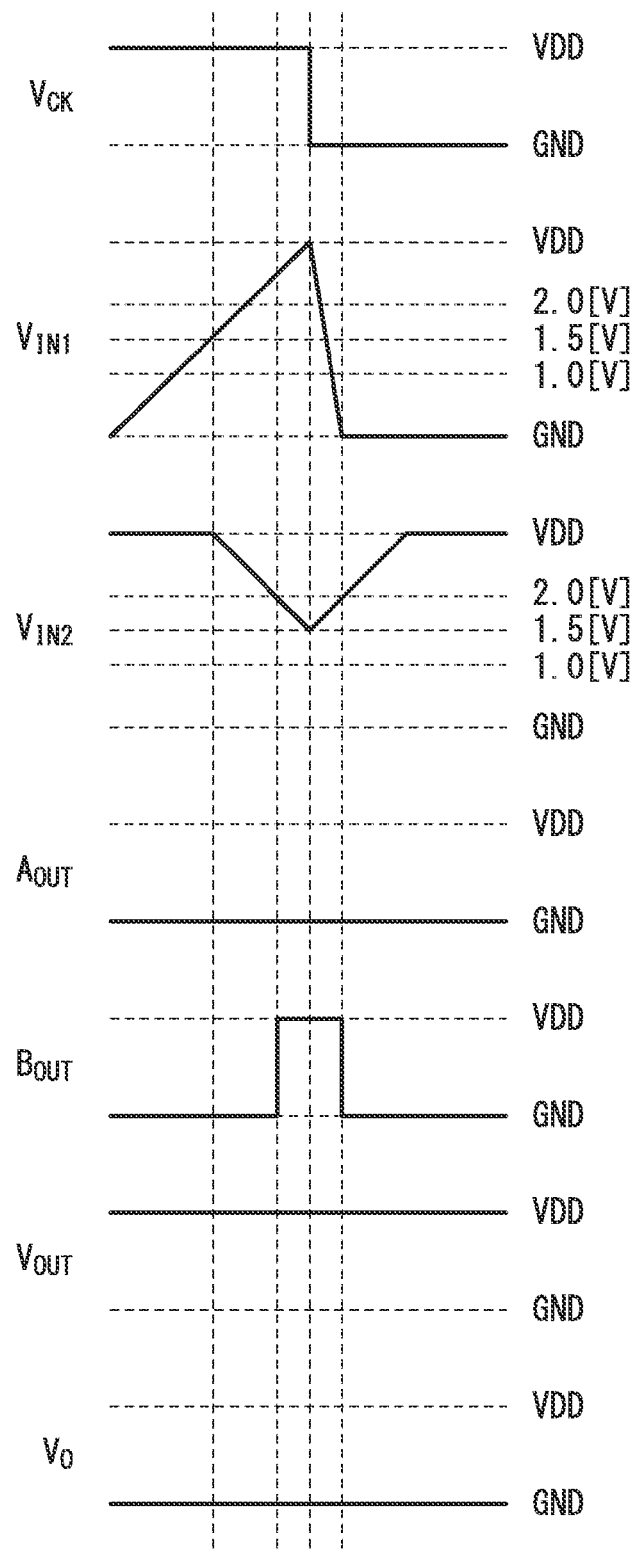
FIG. 28 is a timing chart illustrating a process of the latch circuit according to the third embodiment of the invention.

FIG. 28 shows a case in which the input voltage $V_{CK}$ is changed from the H state to the L state when the input voltages "$V_1=V_{IN1}$" remain the H state and the input voltages "$V_2=V_{IN2}$" reach a voltage, the circuit threshold value near 1.5 [V], during the change of the input voltages "$V_2=V_{IN2}$" from the H state to the L state. In this case, since the input voltages "$V_2=V_{IN2}$" are changed to the voltage equal to the circuit threshold value 1.5 [V] from the H state, the output voltage $B_{OUT}$ is changed from the L state to the H state, the transistor P2 of the inversion clock generation circuit 51 is turned off, and the transistor N3 is turned on. However, since the input voltages "$V_1=V_{IN1}$" are in the H state and the output voltage $A_{OUT}$ is in the L state, the transistors P3 and N2 of the inversion clock generation circuit 51 are turned off. Since the transistors P1 and N1 are turned on, the output voltage $V_{OUT}$ retains the previous state (H state). Accordingly, the output voltage $V_O$ becomes the L state (logic value "0"). At this time, when the switch SW13 is turned on, feedback is thus formed from the output terminal of the inversion clock generation circuit 51 to the other input terminal of the inversion clock generation circuit 51 via the switch SW13 and the input voltage $V_{IN2}$ becomes the H state. During that time, the output voltage $V_O$ of the latch circuit 50 remains the L state. Therefore, even when the latch circuit 50 latches (retains/stores) a signal at the timing at which the input voltages "$V_2=V_{IN2}$" are changed to the voltage near the circuit threshold value, the output voltage $V_O$ is not in an unstable state in which the output voltage $V_O$ is not be stabilized in the H state or the L state.

Figure 29:
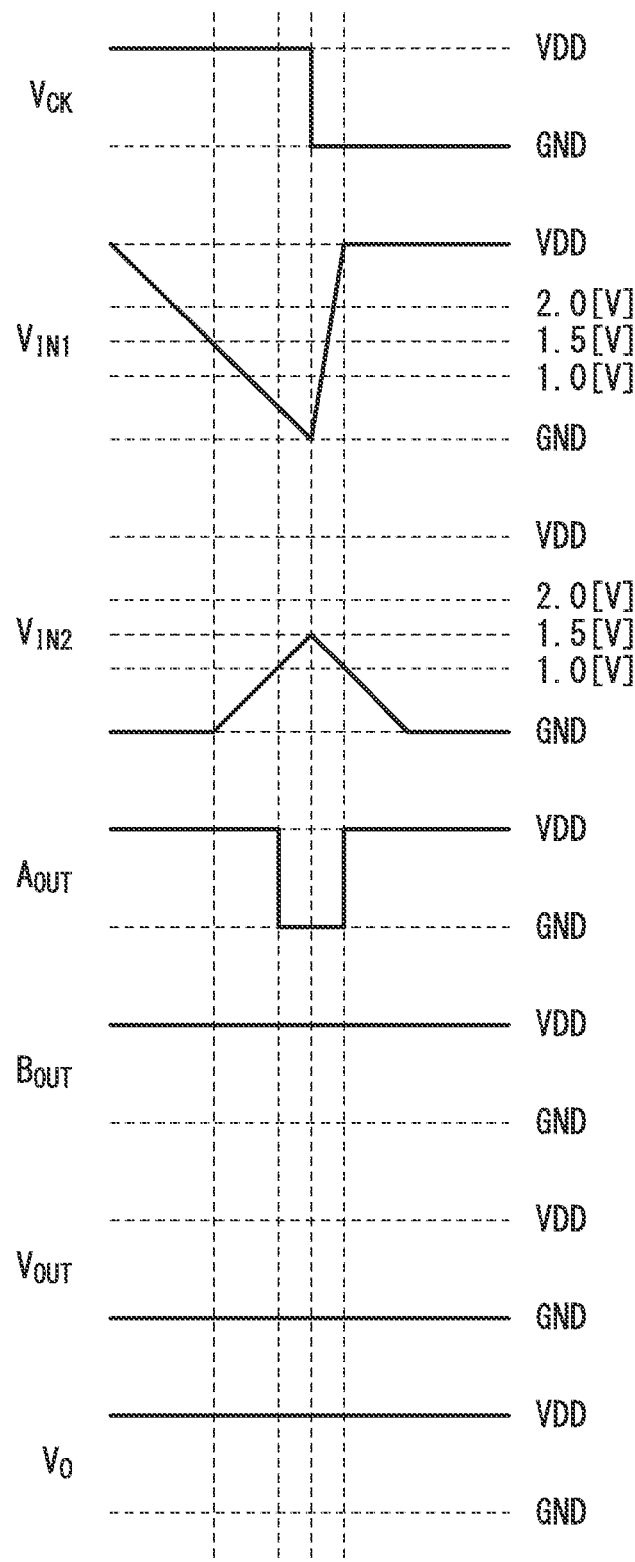
FIG. 29 is a timing chart illustrating a process of the latch circuit according to the third embodiment of the invention.

FIG. 29 shows a case in which the input voltage $V_{CK}$ is changed from the H state to the L state when the input voltages "$V_1=V_{IN1}$" are in the L state and the input voltages "$V_2=V_{IN2}$" reach a voltage, the circuit threshold value near 1.5 [V], during the change of the input voltages "$V_2=V_{IN2}$" from the L state to the H state. In this case, since the input voltages "$V_2=V_{IN2}$" are changed to the voltage equal to the circuit threshold value 1.5 [V] from the L state, the output voltage $A_{OUT}$ is changed from the H state to the L state, the transistor N2 of the inversion clock generation circuit 51 is turned off, and the transistor P3 is turned on. However, since the input voltages "$V_1=V_{IN1}$" are in the L state and the output voltage $B_{OUT}$ is in the H state, the transistors P2 and N1 of the inversion clock generation circuit 51 are turned off. Since the transistors P3 and N3 are turned on, the output voltage $V_{OUT}$ retains the previous state (L state). Accordingly, the output voltage $V_O$ becomes the H state (logic value "1"). At this time, when the switch SW13 is turned on, feedback is thus formed from the output terminal of the inversion clock generation circuit 51 to the other input terminal of the inversion clock generation circuit 51 via the switch SW13 and the input voltage $V_{IN2}$ becomes the L state. During that time, the output voltage $V_O$ of the latch circuit 50 remains the H state. Therefore, even when the latch circuit 50 latches (retains/stores) a signal at the timing at which the input voltages "$V_2=V_{IN2}$" are changed to the voltage near the circuit threshold value, the output voltage $V_O$ is not in an unstable state in which the output voltage $V_O$ is not be stabilized in the H state or the L state.

Since the latch circuit shown in FIG. 23 latches (retains/stores) a signal at the timing at which the input voltage is changed to a voltage near the circuit threshold value, as described above, the state of the output signal is not unstable, thereby reducing the erroneous process of the rear-stage circuit.

Fourth Embodiment

Figure 30:
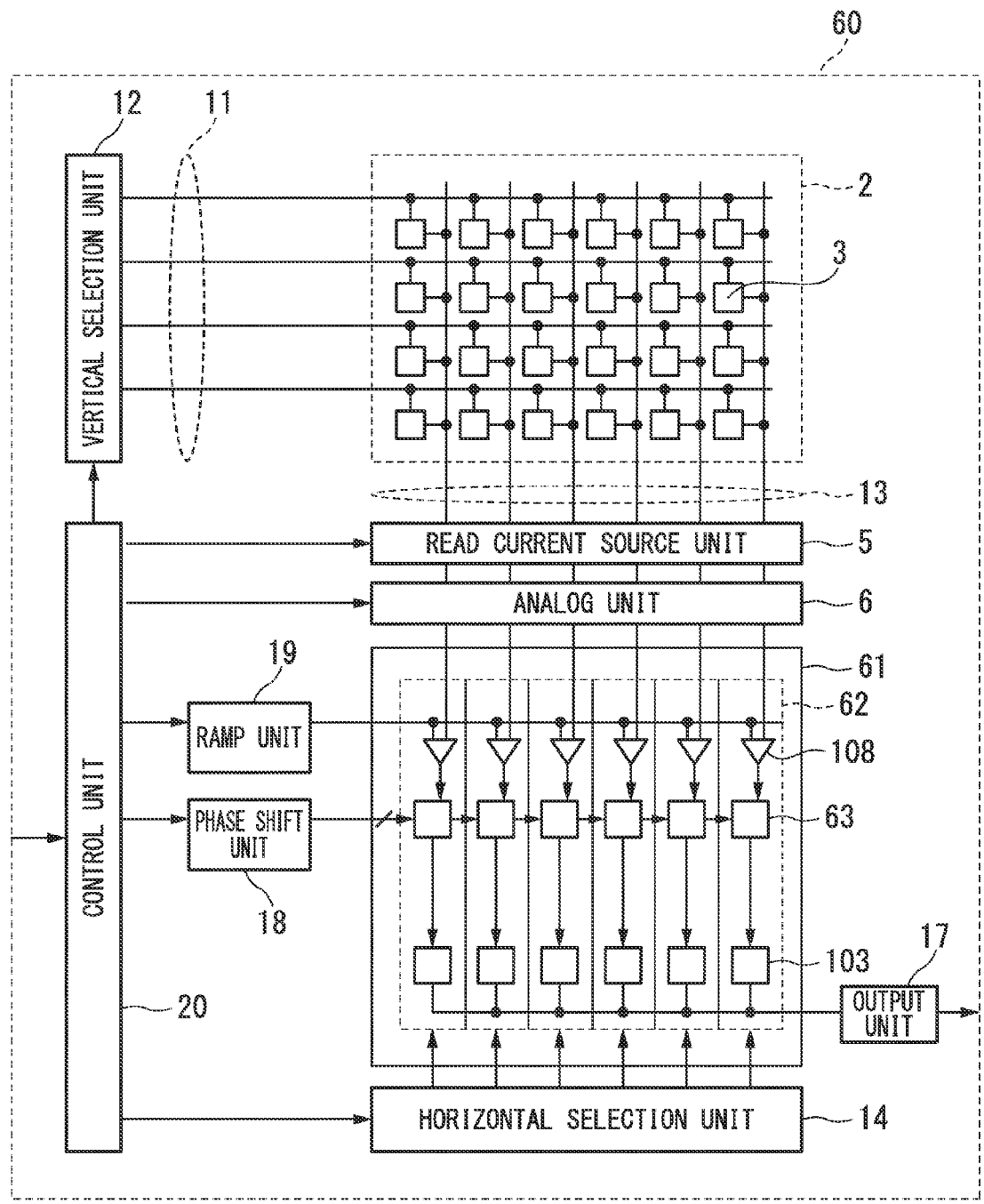
FIG. 30 is a block diagram illustrating the configuration of an imaging device according to a fourth embodiment of the invention.

Next, a fourth embodiment of the invention will be described. FIG. 30 is a diagram illustrating an example of the configuration of an imaging device according to this embodiment. The same reference numerals of the constituent elements in FIG. 12 are given to constituent elements shown in FIG. 30, and the description thereof will not be repeated. Hereinafter, differences between the constituent elements of the fourth and second embodiments will be mainly described.

Figure 31:
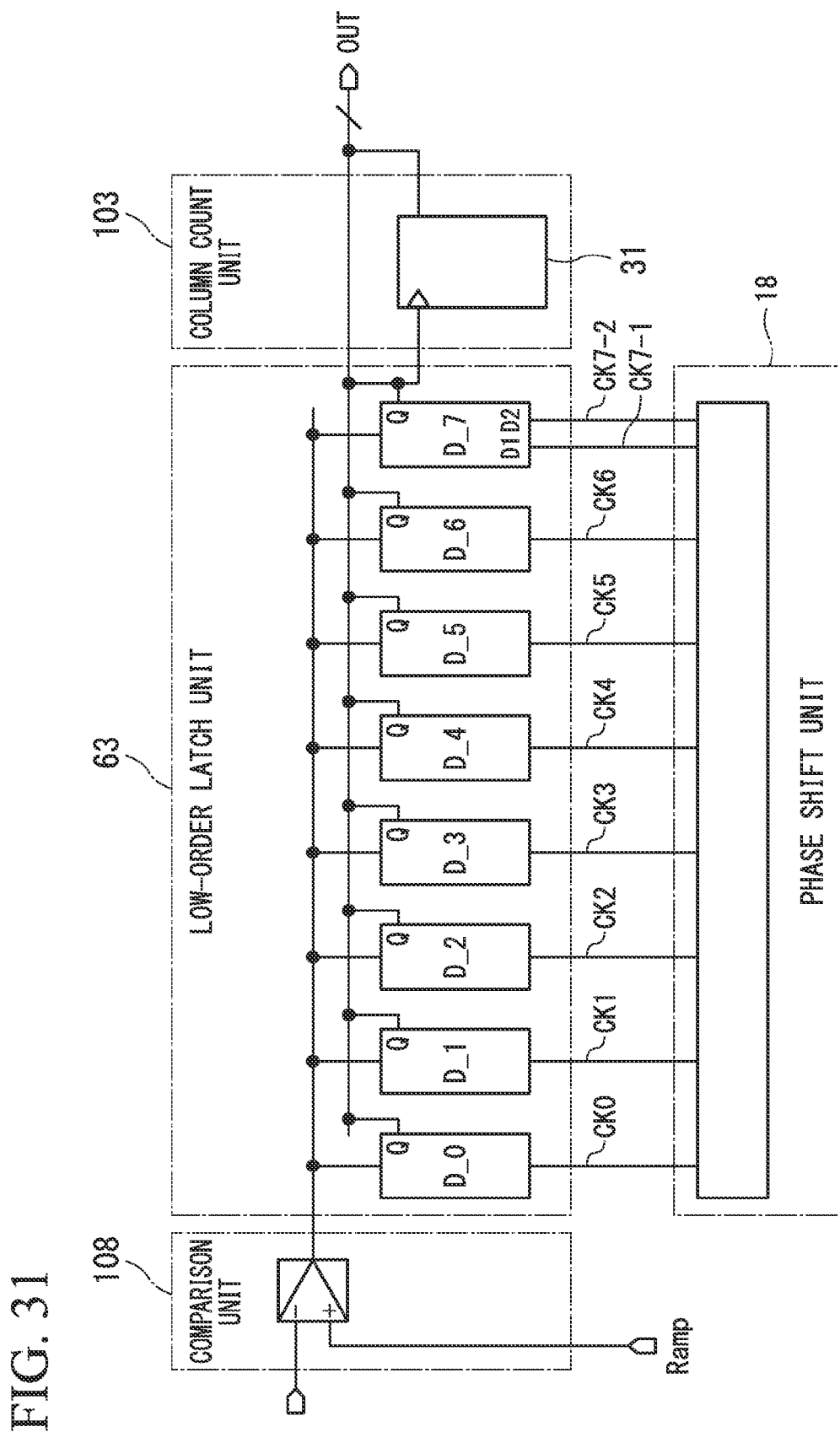
FIG. 31 is a block diagram illustrating the configuration of a column AD conversion unit of the imaging device according to the fourth embodiment of the invention.
Figure 32:
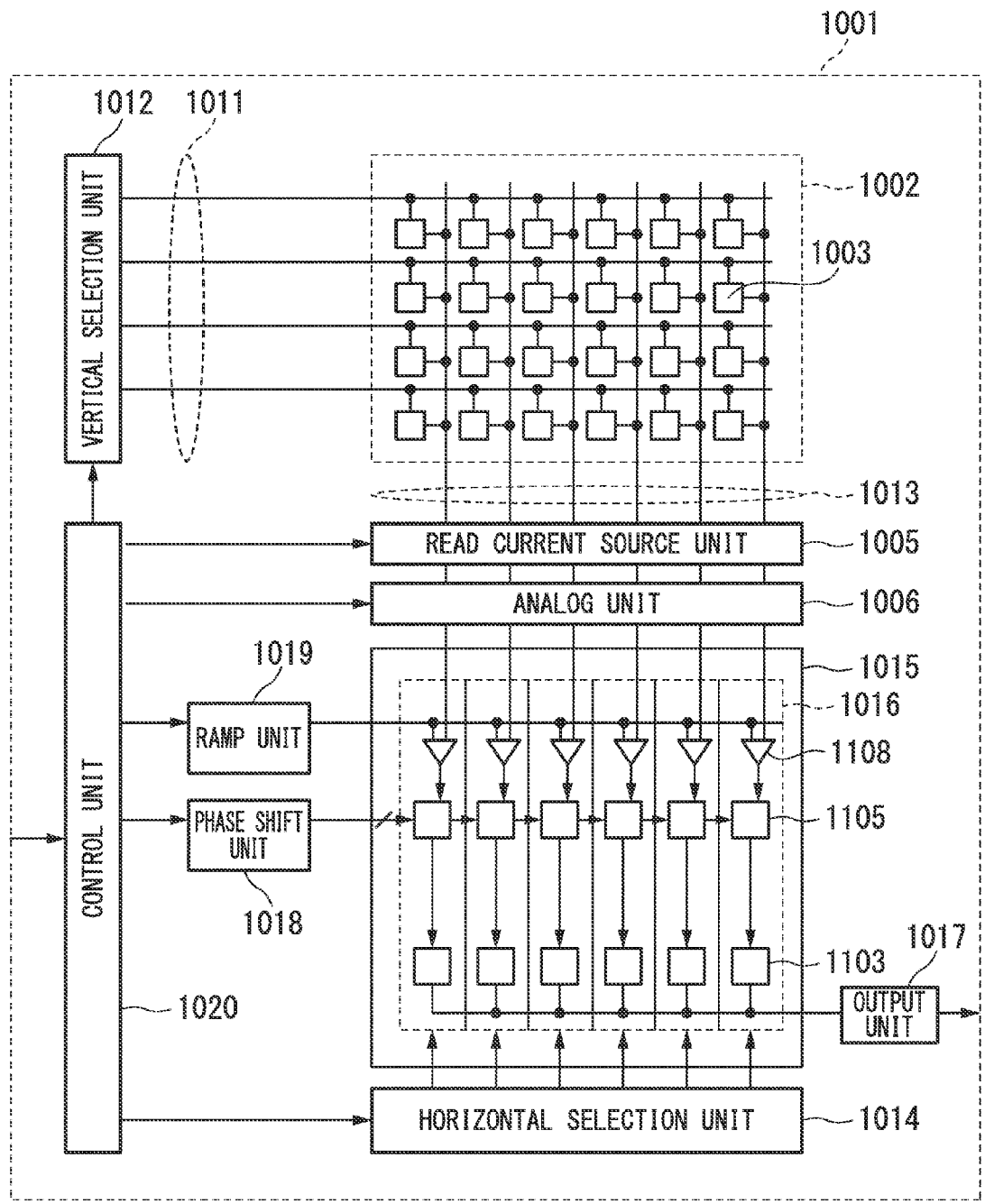
FIG. 32 is a block diagram illustrating the configuration of an imaging device according to the related art.
Figure 33A:
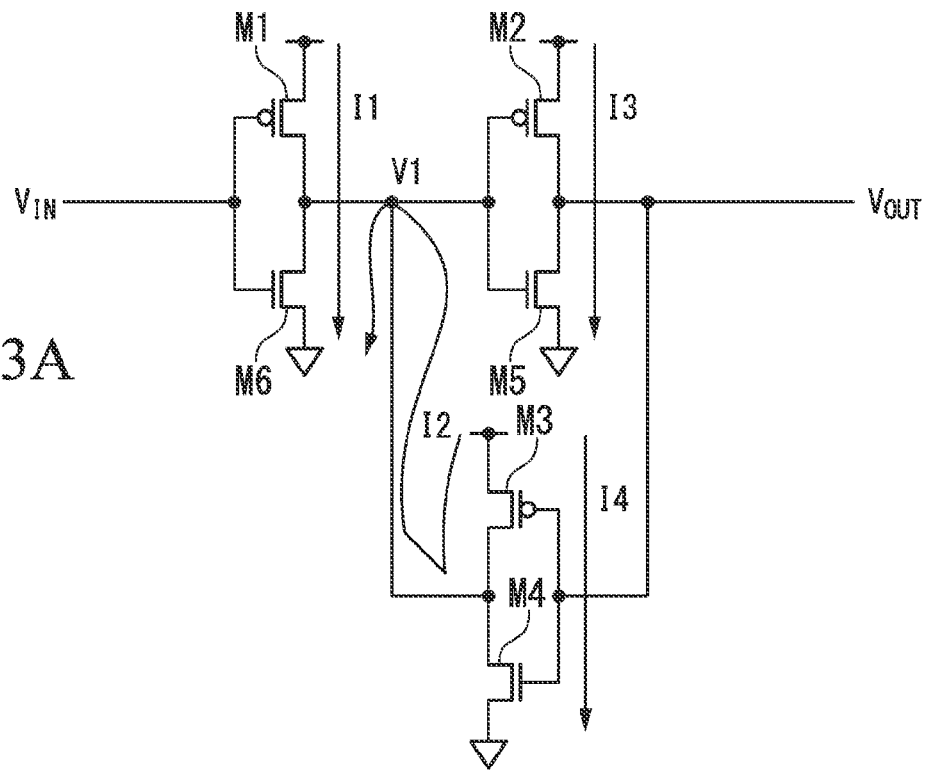
FIG. 33A is a circuit diagram illustrating the configuration of a Schmitt trigger circuit according to the related art.
Figure 33B:
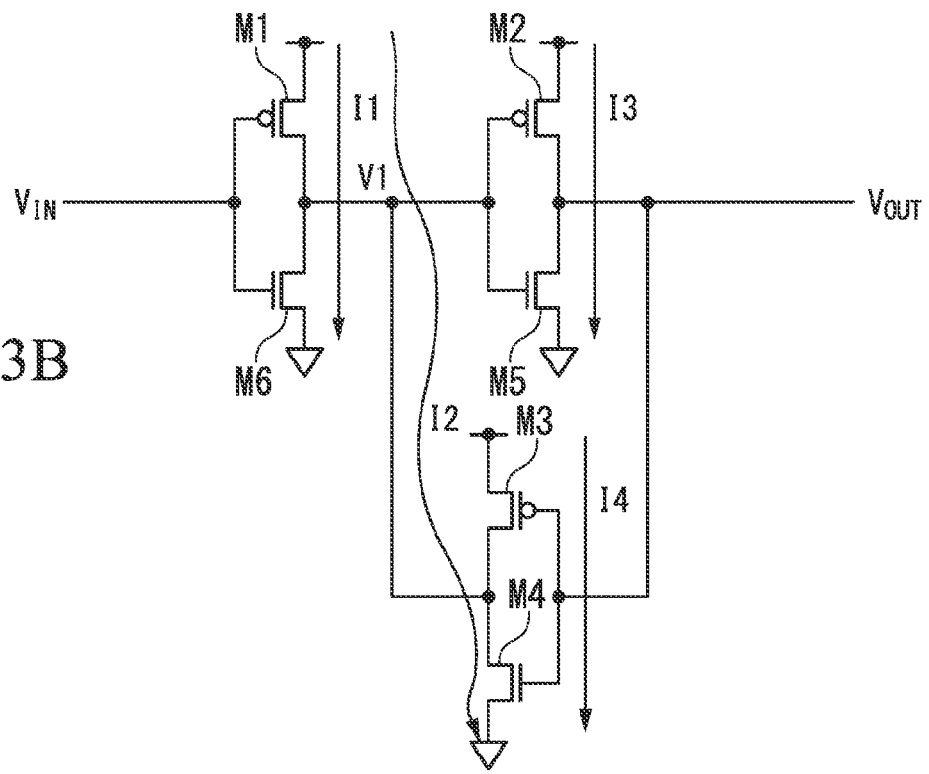
FIG. 33B is a circuit diagram illustrating the configuration of the Schmitt trigger circuit according to the related art.

An imaging device 60 shown in FIG. 30 is different from the imaging device 1 shown in FIG. 12 in that a lower-order latch unit 63 is provided instead of the clock generation unit 104 and the lower-latch unit 105. A column processing unit 61 includes column AD conversion units 62 which include the lower-order latch unit 63. Hereinafter, the detailed configuration of the column AD conversion unit 62 will be described. The column AD conversion unit 62 is installed in each column, and thus six column AD conversion units 62 are installed in FIG. 30. The column AD conversion units 62 in the columns have the same configuration. The column AD conversion unit 62 includes a comparison unit 108 (comparison circuit), the low-order latch unit 63, and a column count unit 103. FIG. 31 is a diagram illustrating the detailed configuration of the column AD conversion unit 62.

The comparison unit 108 converts the magnitude of the pixel signal Pixel into information (the pulse width of the pulse signal) in the time axis direction by comparing the signal voltage corresponding to the analog pixel signal Pixel output from the unit pixel 3 of the imaging unit 2 via the vertical signal line 13 to the ramp wave Ramp supplied from the ramp unit 19. For example, the comparison output of the comparison unit 108 becomes a high level (H level) when the ramp voltage is greater than the signal voltage. The comparison output becomes a low level (L level) when the ramp voltage is equal to or less than the signal voltage.

The low-order latch unit 63 receives the comparison output of the comparison unit 108 and latches (retains and stores) the logic state (low-order phase signal) of the multi-phase clocks (CK0 to CK6 and CK7-1) having a constant phase difference, output from the phase shift unit 18 at a conversion timing of the comparison output. More specifically, the low-order latch unit 63 includes latch circuits D_0 to D_7 that latch the logic state (low-order phase signal) at predetermined timings of the clocks CK0 to CK7-1, which are the outputs of the phase shift unit 18, by the comparison output from the comparison unit 108. The clock CK7-1 input to the latch circuit D_7 of the low-order latch unit 63 is output as a count clock to be counted by the column count unit 103.

The latch circuits D_0 to D_6 are configured by logic circuits such as NAND circuits or inverter circuits having a given circuit threshold value. The latch circuit D_7 is configured by the inversion clock generation circuit and the NAND circuit according to the third embodiment as in FIG. 23, and clocks CK7-1 and CK7-2 output from the phase shift unit 18 are input. The clock CK7-1 corresponds to the input voltage $V_1$ in FIG. 23 and the clock CK7-2 corresponds to the input voltage $V_2$ in FIG. 23. The column count unit 103 includes a counter circuit 31 that counts, as a count clock, the clock CK7-1 output from the phase shift unit 18 and input via the low-order latch unit 63.

The phase shift unit 18 is configured by a delay circuit or the like in which a plurality of delay units delaying a pulse signal are connected to each other. The delay units of the phase shift unit 18 are connected to each other in eight stages, and thus the phase shift unit 18 outputs nine-phase clocks CK0, CK1, CK2, CK3, CK4, CK5, CK6, CK7-1, and CK7-2. The delay circuit of the phase shift unit 18 may be a ring delay circuit in which a plurality of inversion elements are connected to each other in a ring form, as long as the clocks CK7-1 and CK7-2 are signals indicating a phase relation corresponding to the input voltages $V_1$ and $V_2$ in FIG. 23, respectively. In this case, the ring delay circuit itself includes an odd number of delay units, as in a symmetric oscillation circuit. However, an asymmetric oscillation circuit in which the outputs are equivalently even (particularly, a power of two) may be used. Further, the ring delay circuit itself may be configured as an RDL (Ring Delay Line) circuit including an even number (particularly, a power of two) of delay units. Alternatively, the ring delay circuit itself may be configured as a so-called fully differential oscillation circuit including an even number (particularly, a power of two) of delay units and the outputs of the final stage of the fully differential inversion circuit including the delay units are returned to the reverse side of the inputs of the initial stage.

Since a process of this embodiment is the same as the process described in the second embodiment, the description thereof will not be repeated.

As described above, by disposing the inversion clock generation circuit of the third embodiment in a part of the low-order latch unit 63 of the column AD conversion unit 62, the same function as the Schmitt trigger circuit may be realized, thereby reducing the through-current compared to the Schmitt trigger circuit. Accordingly, the imaging device suppressing erroneous count can be realized.

The embodiments of the invention have hitherto been described in detail with reference to the drawings, but the specific configuration is not limited to the above-described embodiments. The invention also includes design modifications without departing from the gist of the invention.

The invention is not limited to the above-described configurations and is limited only by accompanying claims.

What is claimed is:

1. A clock generation circuit generating an output clock in accordance with a state of a first input clock, comprising:
    a first logic circuit that has a first circuit threshold value lower than a circuit threshold value of a front-stage circuit outputting a voltage having a logic state corresponding to the circuit threshold value as the first input clock, receives the first input clock output from the front-stage circuit, and outputs a first output signal in accordance with a logic state of the first input clock and the first circuit threshold value;
    a second logic circuit that has a second circuit threshold value higher than the circuit threshold value of the front-stage circuit, receives the first input clock output from the front-stage circuit, and outputs a second output signal in accordance with the logic state of the first input clock and the second circuit threshold value; and
    a switch circuit that receives the first and second output signals and outputs, as the output clock, any one of first and second voltages corresponding to different logic states of the first and second output signals when logic states of the first and second output signals are changed from the different states to the same state.

2. The clock generation circuit according to claim 1, wherein the first and second logic circuits are inverter circuits.

3. The clock generation circuit according to claim 1, wherein the switch circuit includes:
    a first transistor which includes first and second terminals and a first control terminal and in which the third voltage is connected to the first terminal and the first output signal is connected to the first control terminal, wherein third and fourth voltages correspond to the different logic states;
    a second transistor which includes third and fourth terminals and a second control terminal and in which the second terminal is connected to the third terminal, an output terminal outputting any one of the third and fourth voltages is connected to the fourth terminal, and the second output signal is connected to the second control terminal;
    a third transistor which includes fifth and sixth terminals and a third control terminal and in which the output terminal is connected to the fifth terminal and the first output signal is connected to the third control terminal; and
    a fourth transistor which includes seventh and eighth terminals and a fourth control terminal and in which the sixth terminal is connected to the seventh terminal, the fourth voltage is connected to the eighth terminal, and the second output signal is connected to the fourth control terminal.

4. The clock generation circuit according to claim 3,
wherein, when the first output signal is in a high state, the first transistor is turned off and the third transistor is turned on,
when the first output signal is in a low state, the first transistor is turned on and the third transistor is turned off,
when the second output signal is in the high state, the second transistor is turned off and the fourth transistor is turned on, and
when the second output signal is in the low state, the second transistor is turned on and the fourth transistor is turned off.

5. The clock generation circuit according to claim 1,
wherein the first and second output signals are input to the switch circuit, a second input clock having a phase reverse to a phase of the first input clock and advanced by a predetermined time from the first input clock is also input to the switch circuit, and when different logic states of the first and second output signals are at least changed to the same logic state of the first output signal, the second output signal, and the second input clock, the switch circuit outputs, as the output clock, a voltage having a reverse logic of the second input clock of the first and second voltages corresponding to the different logic state.

6. The clock generation circuit according to claim 5, wherein the switch circuit includes first and second switch circuits, the first and second output signals are input to the first switch circuit, the second input signal is input to the second switch circuit, and a threshold value of the second switch circuit is higher than the first circuit threshold value and is lower than the second circuit threshold value.

7. The clock generation circuit according to claim 6, wherein the first switch circuit includes:
- a first transistor which includes a first terminal, a second terminal, and a first control terminal and in which the third voltage is connected to the first terminal and the first output signal is connected to the first control terminal, wherein third and fourth voltages correspond to the different logic states;
- a second transistor which includes a third terminal, a fourth terminal, and a second control terminal and in which the second terminal is connected to the third terminal and the second output signal is connected to the second control terminal;
- a third transistor which includes a fifth terminal, a sixth terminal, and a third control terminal and in which the first output signal is connected to the third control terminal; and
- a fourth transistor which includes a seventh terminal, an eighth terminal, and a fourth control terminal and in which the sixth terminal is connected to the seventh terminal, the fourth voltage is connected to the eighth terminal, and the second output signal is connected to the fourth control terminal, and the second switch circuit includes:
- a fifth transistor which includes a ninth terminal, a tenth terminal, and a fifth control terminal and in which the ninth terminal is connected to the fourth terminal, the tenth terminal is connected to an output terminal outputting any one of the third and fourth voltages, and the second input signal is input to the fifth control terminal; and
- a sixth transistor which includes an eleventh terminal, a twelfth terminal, and a sixth control terminal and in which the eleventh terminal is connected to the output terminal, the twelfth terminal is connected to the fifth terminal, and the second input signal is input to the sixth control terminal.

8. The clock generation circuit according to claim 7, wherein, when the first output signal is in a high state, the first transistor is turned off and the third transistor is turned on, when the first output signal is in a low state, the first transistor is turned on and the third transistor is turned off, when the second output signal is in the high state, the second transistor is turned off and the fourth transistor is turned on, when the second output signal in the low state, the second transistor is turned on and the fourth transistor is turned off, when the second input clock is in the high state, the fifth transistor is turned off and the sixth transistor is turned on, and when the second input clock is in the low state, the fifth transistor is turned on and the sixth transistor is turned off.

9. An imaging device comprising:
an imaging unit that includes a plurality of pixels each including a photoelectric conversion element, the plurality of pixels outputting a first pixel signal in accordance with a reset level during a first time and a second pixel signal in accordance with an amount of an incident electromagnetic wave during a second time from the plurality of pixels; and an AD conversion unit that outputs a first digital value corresponding to the first pixel signal and a second digital value corresponding to the second pixel signal, wherein the AD conversion unit includes:
- a reference signal generation circuit that generates a reference signal increasing or decreasing over time;
- a comparison circuit that compares a pixel signal, which is outputting of the pixel and is subjected to AD conversion, to the reference signal and ends the comparison process at a timing at which the reference signal satisfies a predetermined condition with respect to the pixel signal;
- a delay circuit that includes a plurality of delay elements, which are connected to each other and delay a pulse signal, and outputs low-order phase signals formed by output signals output from the plurality of delay elements;
- a latch circuit that latches the low-order phase signals at a timing associated with the end of the comparison process;
- the clock generation circuit according to claim 5, to which two of the output signals forming the low-order phase signals output from the delay circuit are input as the first and second input clocks; and
- a counter circuit that counts the output clock output from the clock generation circuit as a count clock.

10. An imaging device comprising:
an imaging unit that includes a plurality of pixels each including a photoelectric conversion element, the plurality of pixels outputting a first pixel signal in accordance with a reset level during a first time and a second pixel signal in accordance with an amount of an incident electromagnetic wave during a second time from the plurality of pixels; and an AD conversion unit that outputs a first digital value corresponding to the first pixel signal and a second digital value corresponding to the second pixel signal, wherein the AD conversion unit includes:
- a reference signal generation circuit that generates a reference signal increasing or decreasing over time;
- a comparison circuit that compares a pixel signal, which is outputting of the pixel and is subjected to AD conversion, to the reference signal and ends the comparison process at a timing at which the reference signal satisfies a predetermined condition with respect to the pixel signal;
- a delay circuit that includes a plurality of delay elements, which are connected to each other and delay a pulse signal, and outputs low-order phase signals formed by output signals output from the plurality of delay elements;

a latch circuit that latches the low-order phase signals at a timing associated with the end of the comparison process;

the clock generation circuit according to claim 1, to which one of the output signals forming the low-order phase signals output from the delay circuit is input as the first input clock; and a counter circuit that counts an output clock output from the clock generation circuit as a count clock.

* * * * *